(12) United States Patent
Chiang et al.

(10) Patent No.: US 11,605,779 B2
(45) Date of Patent: Mar. 14, 2023

(54) MEMORY CELL, METHOD OF FORMING THE SAME, AND SEMICONDUCTOR DIE

(71) Applicant: Taiwan Semiconductor Manufacturing Company, Ltd., Hsinchu (TW)

(72) Inventors: Hung-Li Chiang, Taipei (TW); Jer-Fu Wang, Taipei (TW); Jung-Piao Chiu, Kaohsiung (TW); Yu-Sheng Chen, Taoyuan (TW); Tzu-Chiang Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 51 days.

(21) Appl. No.: 17/144,079

(22) Filed: Jan. 7, 2021

(65) Prior Publication Data

US 2022/0216400 A1  Jul. 7, 2022

(51) Int. Cl.
*H01L 45/00* (2006.01)
*H01L 27/24* (2006.01)

(52) U.S. Cl.
CPC ...... *H01L 45/1253* (2013.01); *H01L 27/2463* (2013.01); *H01L 45/1608* (2013.01); *H01L 45/1675* (2013.01); *H01L 45/1683* (2013.01)

(58) Field of Classification Search
None
See application file for complete search history.

(56) References Cited

U.S. PATENT DOCUMENTS

| | | | | |
|---|---|---|---|---|
| 2005/0127347 A1* | 6/2005 | Choi | ............... | H01L 21/7684 438/622 |
| 2007/0232015 A1* | 10/2007 | Liu | ............... | H01L 45/06 257/E21.589 |
| 2009/0072216 A1* | 3/2009 | Lung | ............... | H01L 45/1675 257/4 |
| 2009/0184310 A1* | 7/2009 | Lung | ............... | H01L 45/144 257/E47.001 |
| 2012/0267597 A1* | 10/2012 | Lung | ............... | H01L 45/1691 257/E45.001 |
| 2019/0140173 A1* | 5/2019 | Huang | ............... | H01L 21/31053 |
| 2020/0327935 A1* | 10/2020 | Kim | ............... | G11C 11/161 |

* cited by examiner

*Primary Examiner* — Mounir S Amer
(74) *Attorney, Agent, or Firm* — JCIPRNET

(57) ABSTRACT

Provided are a memory cell and a method of forming the same. The memory cell includes a first dielectric pattern, a second dielectric pattern, a first bottom electrode, a first storage pattern, and a first top electrode. The first bottom electrode is disposed between the first dielectric pattern and the second dielectric pattern, and the first bottom electrode interfaces a first sidewall of the first dielectric pattern and a sidewall of the second dielectric pattern. The first storage pattern is disposed on the first dielectric pattern, the second dielectric pattern and the first bottom electrode, wherein the first storage pattern is electrically connected to the first bottom electrode. The first storage pattern is between the first bottom electrode and the first top electrode. A semiconductor die including a memory array is also provided.

20 Claims, 17 Drawing Sheets

(a)

(b)

MEMORY CELL, METHOD OF FORMING THE SAME, AND SEMICONDUCTOR DIE

BACKGROUND

Nonvolatile memory is one kinds of memory that can be adopted to electronic devices such as cell phones, cameras, or computers to save data. Flash memory is a widely used type of nonvolatile memory. However, flash memory is expected to meet its physical limits, as device scaling-down continues. Therefore, alternatives types of nonvolatile memory such as a phase change random access memory (PCRAM) or a resistive random access memory (RRAM) are being explored. PCRAM is based upon a material that can be either amorphous state or crystalline state. When the material is in the amorphous state, the material has a high electrical resistance. When the material is in the crystalline state, the material has a low electrical resistance. The state of the material can be controlled by heating or cooling the material. For example, the material may be heated, for example, by passing current through a heating element to enters its crystalline state. RRAM is based upon a material that can be either high-resistive state or low-resistive state under difference electrical field.

PCRAMs or RRAMs have characteristics of fast read and wright times, non-destructive reads, high scalability and an ability to hold multiple bits in a single cell. However, while existing PCRAMs or RRAMs have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
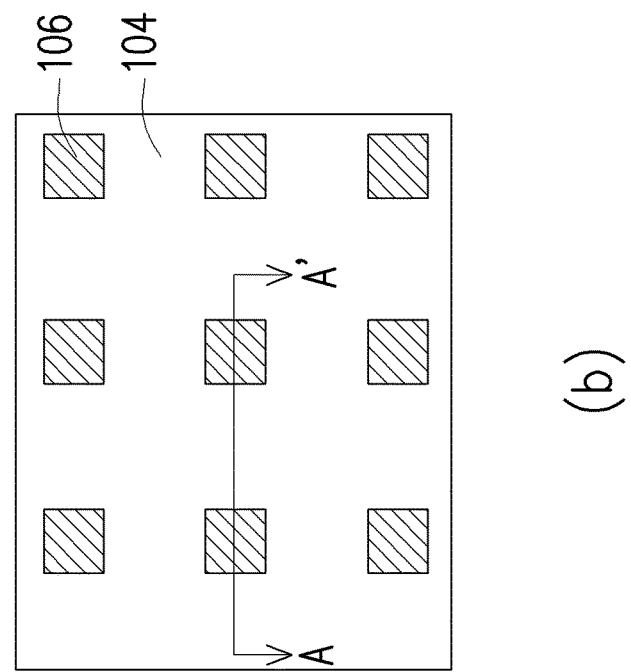
FIG. 1 to FIG. 9 are schematic cross-section views and top views that illustrate a method of forming a memory cell in accordance with a first embodiment.
Figure 1:
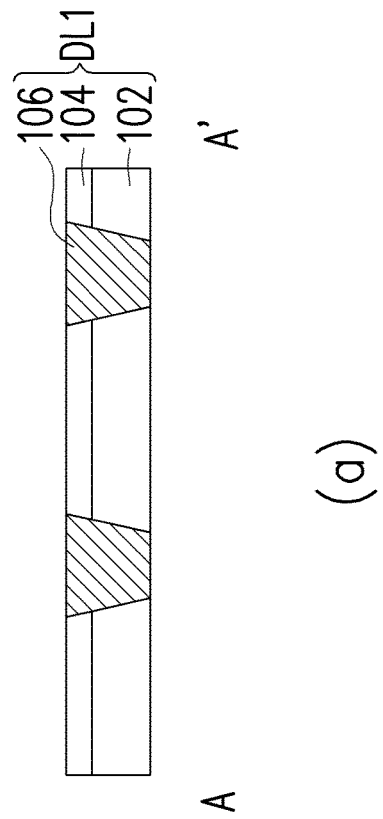

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, bottom electrodes are disposed on sidewalls of dielectric patterns, so that the contact area between the top ends of the bottom electrodes and the storage patterns is small enough to efficiently confine the heat field or electrical field in PCRAM or RRAM, thereby reducing the operating current or operating voltage of PCRAM or RRAM.

FIG. 1 to FIG. 9 are schematic cross-section views and top views that illustrate a method of forming a memory cell in accordance with a first embodiment. In FIG. 1 to FIG. 9, (a) and (b) are respectively a cross-section view and a top view, wherein the cross-section views are taken along line A-A' as shown in the top views. The memory cell illustrated in the following embodiments may be applied to, but not is limited thereto.

Figure 9:
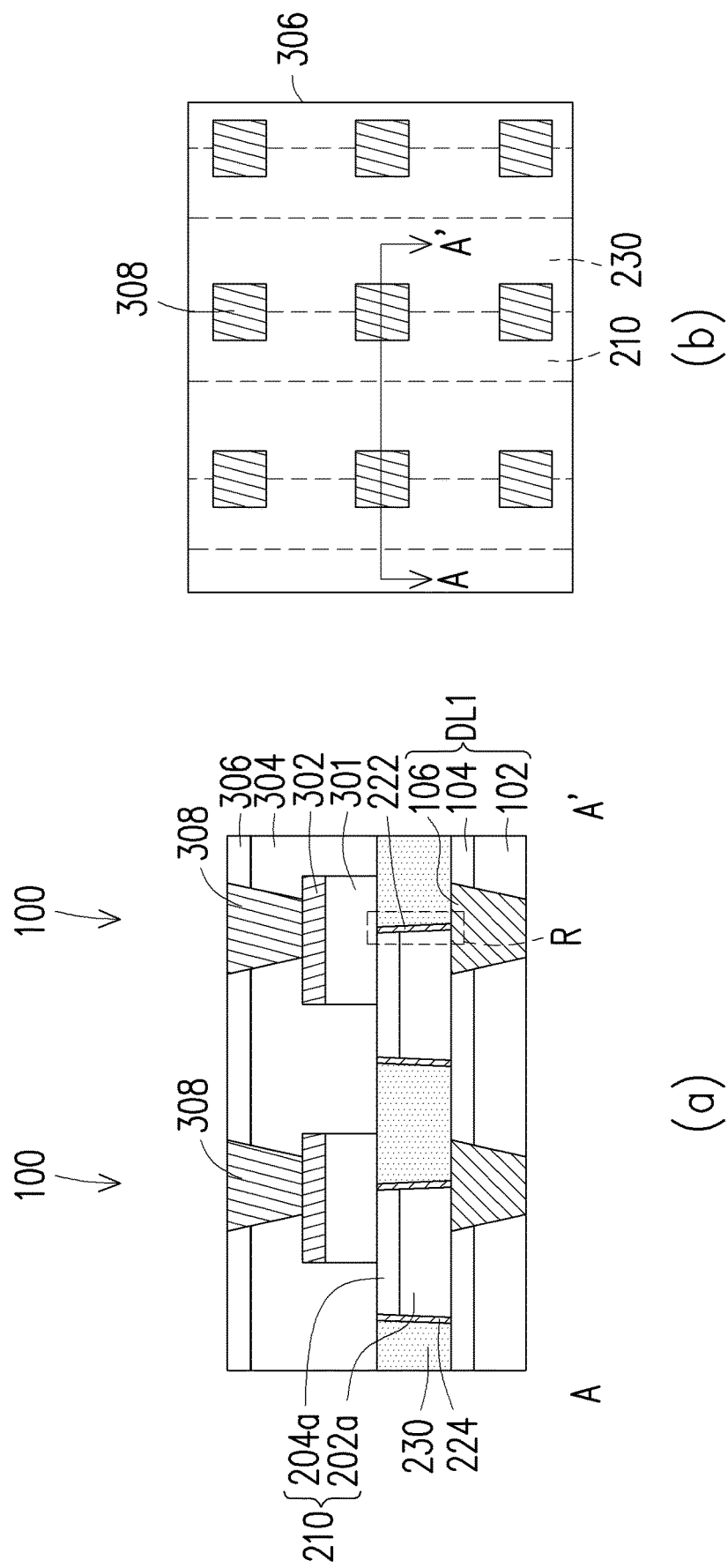

Referring to FIG. 1, a method of forming memory cells 100 (as shown in FIG. 9) includes following steps. First, a dielectric layer DL1 illustrated in FIG. 1 is provided. The dielectric layer DL1 include a patterned dielectric layer 102, a patterned etching stop layer 104 on the patterned dielectric layer 102, and conductors 106 embedded in the patterned dielectric layer 102 and patterned etching stop layer 104. In some embodiments, the conductors 106 are formed by following steps. First, a stacked layer (not illustrated) including a dielectric material layer (not illustrated) and an etching stop material layer (not illustrated) on the dielectric material layer is formed. Next, a mask pattern (not illustrated) is formed on the stacked layer to define regions that expose the stacked layer.

The mask pattern may be a patterned photoresist layer. Then, portions of the stacked layer are removed through the regions so as to form conductor openings (not illustrated) in the stacked layer. The portions of the stacked layer may be removed by an etching process. After forming the conductor openings, the mask pattern is removed by any suitable method, such as ashing. Then, the conductor openings are filled with a conductive material. The conductive material may cover a top surface of the stacked layer. After that, a planarization process (e.g., a CMP process) is performed to remove excessive conductive material, thereby the conductors 106 are formed.

In some embodiments, the patterned dielectric layer 102 includes a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The patterned dielectric layer 102 may be formed by any suitable method, such as chemical vapor deposition (CVD).

In some embodiments, the patterned etching stop layer 104 includes a dielectric material, such as silicon oxide, silicon nitride, silicon oxynitride, or a spin-on dielectric material. The patterned etching stop layer 104 may be formed by any suitable method, such as chemical vapor deposition (CVD). The patterned etching stop layer 104 and the patterned dielectric layer 102 are made of different materials. For example, the patterned etching stop layer 104 may be made of silicon nitride (e.g., $Si_3N_4$), and the patterned dielectric layer 102 may be made of silicon oxide (e.g., $SiO_2$), but is not limited thereto.

In some embodiments, the conductors 106 may be conductive plugs and may include conductive materials, such as metals or metal alloys including one or more of Al, AlCu, Cu, Ti, TiN, W, and the like. The conductors 106 may be formed by any suitable method, such as chemical vapor deposition (CVD).

Figure 2:
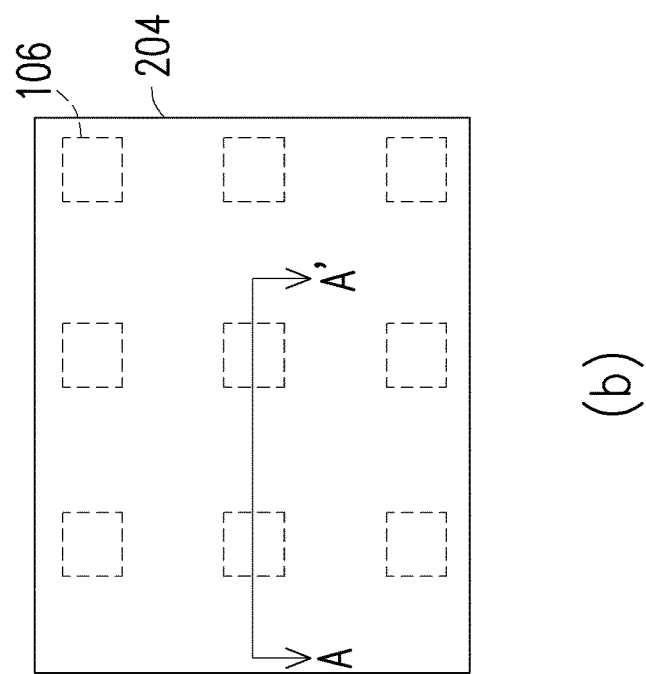
Figure 2:
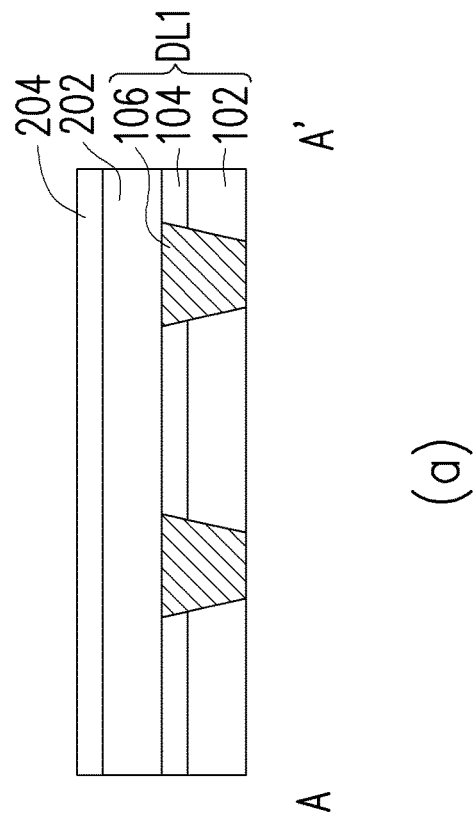

Referring to FIG. 2, a dielectric material layer 202 and an etching stop material layer 204 are formed on the dielectric layer DL1 in sequence. In some embodiments, the dielectric material layer 202 includes a dielectric material, such as silicon oxide, silicon nitride, silicon oxynitride, a spin-on dielectric material, or a low-k dielectric material. The dielectric material layer 202 may be formed by any suitable method, such as chemical vapor deposition (CVD). In some embodiments, the etching stop material layer 204 includes a dielectric material, such as silicon oxide, silicon nitride, silicon oxynitride, or a spin-on dielectric material. The etching stop material layer 204 may be formed by any suitable method, such as chemical vapor deposition (CVD). The etching stop material layer 204 and the dielectric material layer 202 are made of different materials. For example, the etching stop material layer 204 may be made of silicon nitride (e.g., $Si_3N_46l$), and the dielectric material layer 202 may be made of silicon oxide (e.g., $SiO_2$), but is not limited thereto.

Figure 3:
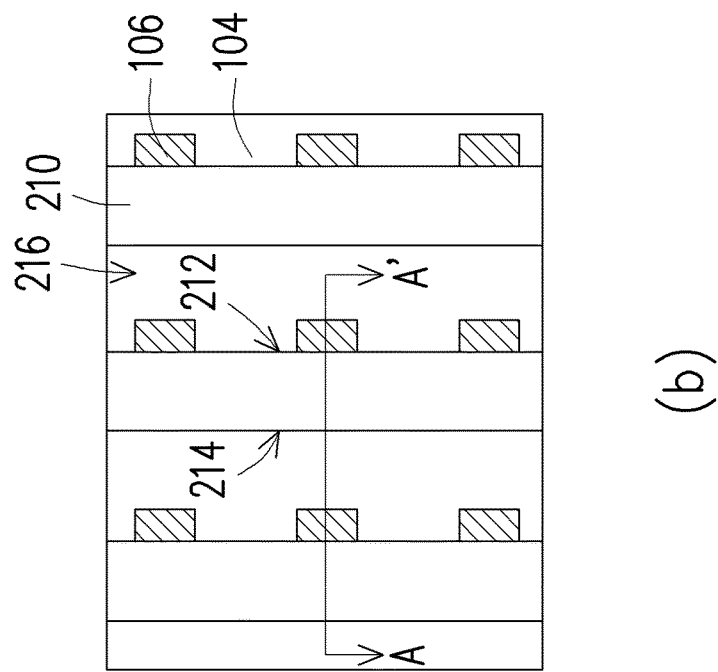
Figure 3:
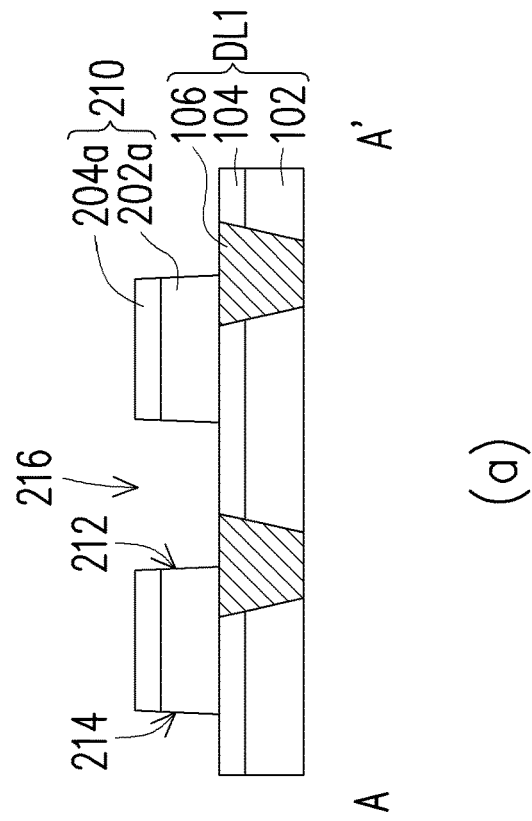

Referring to FIG. 2 and FIG. 3, the dielectric material layer 202 and an etching stop material layer 204 are patterned to form first dielectric patterns 210 on the dielectric layer DL1. The first dielectric patterns 210 may each include a patterned dielectric layer 202a and a patterned etching stop layer 204a on the patterned dielectric layer 202a. In some embodiments, the thickness of the patterned dielectric layers 202a is greater than that of the patterned etching stop layers 204a. Each of the first dielectric patterns 210 has a first sidewall 212 and a second sidewall 214 opposite to the first sidewall 212. The first dielectric patterns 210 are in contact with the conductors 106 embedded in the dielectric layer DL1, and the top surfaces of the conductors 106 are partially exposed by the first dielectric patterns 210. In some embodiments, the first dielectric patterns 210 may be formed by following steps. First, a mask pattern (not illustrated) is formed on the etching stop material layer 204. The mask pattern may be a patterned photoresist layer. Then, portions of the etching stop material layer 204 exposed by the mask pattern and portions of the dielectric material layer 202 under the portions of the etching stop material layer 204 are removed to form the first dielectric patterns 210. The portions of the etching stop material layer 204 and the portions of the dielectric material layer 202 under the portions of the etching stop material layer 204 may be removed by an etching process. The patterned etching stop layer 104 may serve as a stop layer during the process of removing the portions of the dielectric material layer 202. After forming the first dielectric patterns 210, the mask pattern is removed by any suitable method, such as ashing.

In some embodiments, the first dielectric patterns 210 are formed to be a strip-shaped pattern as illustrated in FIG. 3. Trenches 216 that expose the dielectric layer DL1 may be formed between the two adjacent first dielectric patterns 210, and the top surfaces of the conductors 106 may be partially exposed by the trenches 216. In some embodiments, the first dielectric patterns 210 are spaced apart from one another by the trenches 216. The first dielectric patterns 210 may be arranged in a direction perpendicular to the extension direction of the strip-shaped first dielectric patterns 210.

Figure 4:
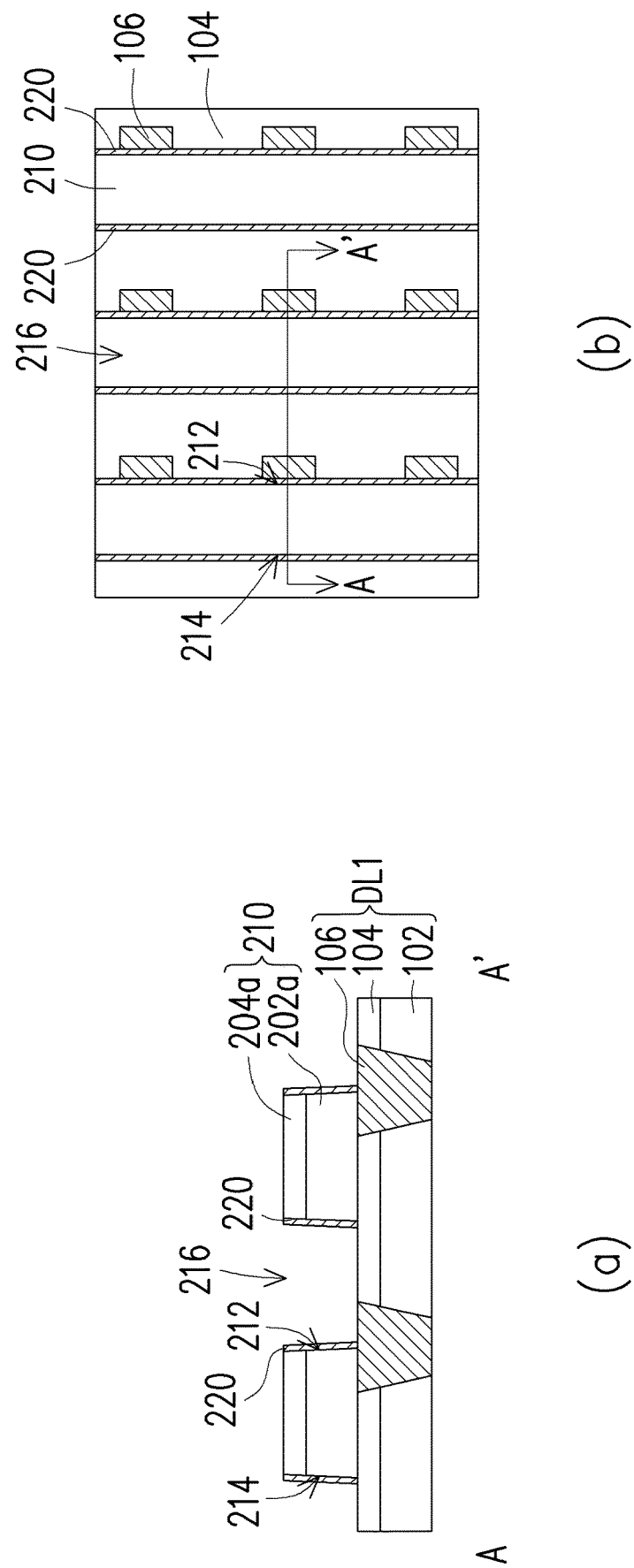

Referring to FIG. 4, bottom electrode layers 220 are formed on the first sidewalls 212 and the second sidewalls 214 of the first dielectric patterns 210. The bottom electrode layers 220 on the first sidewalls 212 of the first dielectric patterns 210 are in contact with the top surfaces of the conductors 106. The bottom electrode layers 220 on the first sidewalls 212 of the first dielectric patterns 210 are electrically insulated from the bottom electrode layers 220 on the second sidewalls 214 of the first dielectric patterns 210. In some embodiments, the bottom electrode layers 220 on the second sidewalls 214 of the first dielectric patterns 210 are electrically insulated from the conductors 106.

In some embodiments, the bottom electrode layers 220 may be formed by following steps. First, a bottom electrode material layer (not illustrated) is formed on the dielectric layer DL1 to conformally cover the first sidewalls 212 of the first dielectric patterns 210, the second sidewalls 214 of the first dielectric patterns 210, the top surfaces of the first dielectric patterns 210, and the top surfaces of the dielectric layer DL1 between the first dielectric patterns 210. Then, portions of the bottom electrode material layer 220 on the top surfaces of the first dielectric patterns 210 and on the top surfaces of the dielectric layer DL1 between the adjacent first dielectric patterns 210 are removed by any suitable method, such as etch back, such that the bottom electrode layers 220 are selectively formed on the first sidewalls 212 of the first dielectric patterns 210 and the second sidewalls 214 of the first dielectric patterns 210. The bottom electrode layers 220 includes a conductive material, such as Ti, Co, Cu, AlCu, W, TiN, TiW, TiAl, TiAlN, Ru, $RuO_x$, or a combination thereof. The bottom electrode layers 220 may be formed by any suitable method, such as CVD, physical vapor deposition (PVD), or the like.

Figure 5:
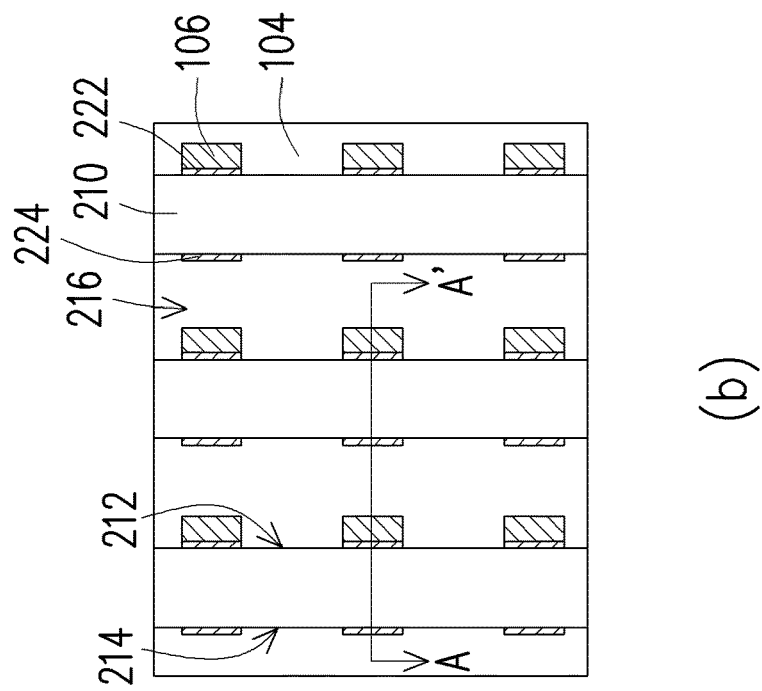
Figure 5:
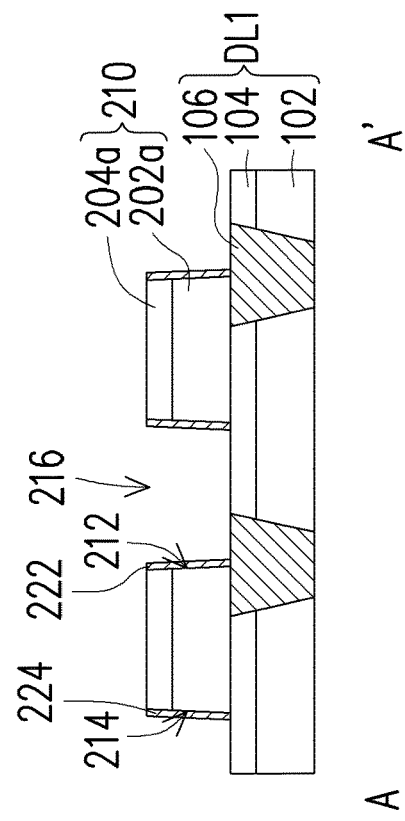

Referring to FIG. 4 and FIG. 5, the bottom electrode layers 220 are patterned to form first bottom electrodes 222 on the first sidewalls 212 of the first dielectric patterns 210 and second bottom electrodes 224 on the second sidewalls 214 of the first dielectric patterns 210, respectively. The conductors 106 disposed under the dielectric layer DL2 are electrically connected to bottom ends of the first bottom electrodes 222. In some embodiments, the first bottom electrodes 222 and the second bottom electrodes 224 may be formed by following steps. First, a mask pattern (not illustrated) is formed on the bottom electrode layers 220. The mask pattern may be a patterned photoresist layer. Then, portions of the bottom electrode layers 220 exposed by the mask pattern are removed to form the first bottom electrodes 222 on the first sidewalls 212 of the first dielectric patterns 210 and the second bottom electrodes 224 on the second sidewalls 214 of the first dielectric patterns 210, respectively. The portions of the bottom electrode layers 220 exposed by the mask pattern may be removed by an etching process. After forming the first bottom electrodes 222 and the second bottom electrodes 224, the mask pattern is removed by any suitable method, such as ashing.

Figure 7:
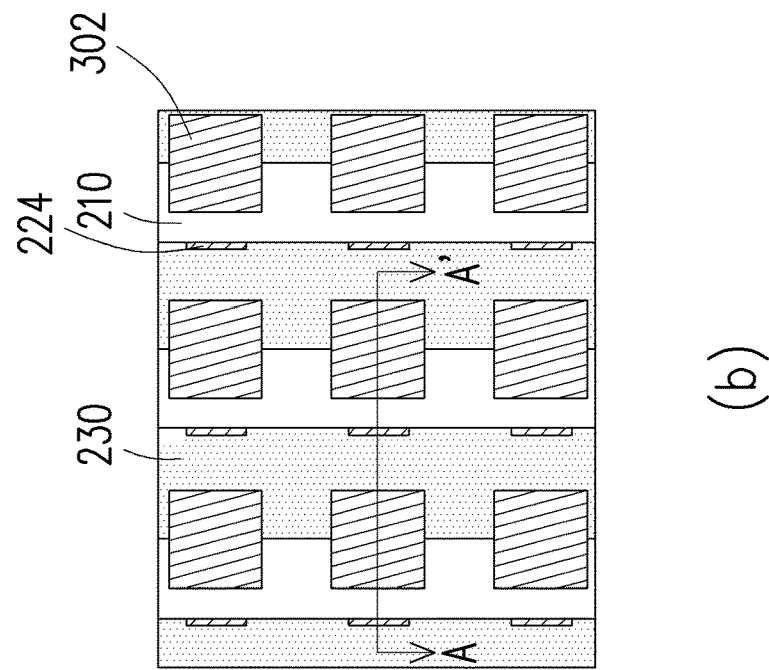
Figure 7:
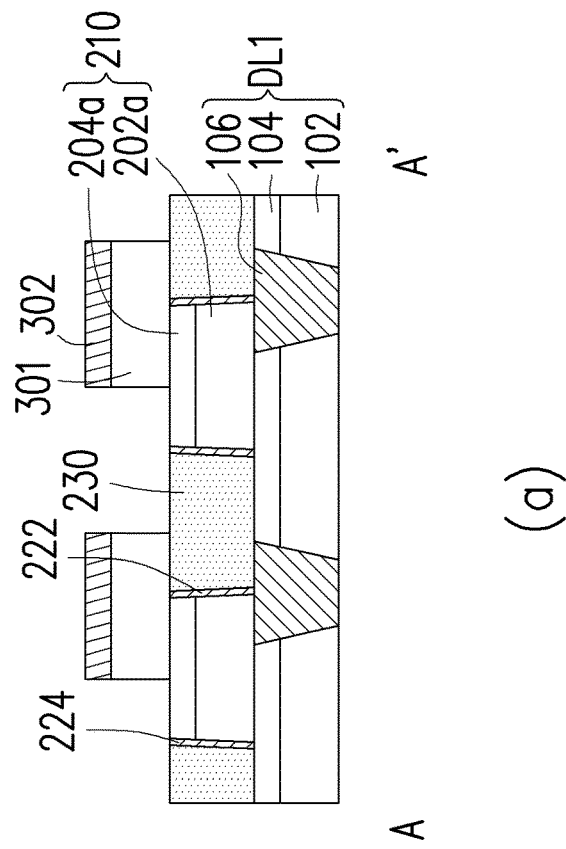

In some embodiments, the first bottom electrodes 222 in contact with the conductors 106 are referred to as heaters electrically connected to the first storage patterns 301 shown in FIG. 7, and the second bottom electrodes 224 are referred to as dummy electrodes electrically insulated from the first storage patterns 301 shown in FIG. 7. The heaters are configured to generate heat in proportion to current applied across the heaters. In the case, the heaters may be made of titanium nitride (TiN), titanium carbide (TiC), tungsten nitride (WN), some other high resistance material, Ru, $RuO_x$, or a combination thereof. In the case where the first bottom electrodes 222 are referred to as the heater, contact area between top ends of the first bottom electrodes 222 and the storage patterns 301 shown in FIG. 7 is small enough to efficiently confine the heat field in PCRAM, thereby reducing the operating current of PCRAM. In some embodiments, the second bottom electrodes 224 may serve as dummy electrodes which are not in contact with and thermally coupled to the storage patterns 301 shown in FIG. 7. In some alternative embodiments, the second bottom electrodes 224 may serve as heaters which are in contact with and thermally coupled to the storage patterns.

In some embodiments, the first bottom electrodes 222 and the second bottom electrodes 224 having shrunken top ends are formed on the opposite sidewalls of the first dielectric patterns 210, so the first bottom electrodes 222 and the second bottom electrodes 224 may have rectangular profiles in a top view, and the first bottom electrodes 222 and the second bottom electrodes 224 may include rounding top ends in a cross-section view. In some embodiments, contact area between top ends of the first bottom electrodes 222 and the storage patterns 301 is smaller than that of bottom ends of the first bottom electrodes 222. For example, contact area between top ends of the first bottom electrodes 222 and the storage patterns 301 is smaller than contact area between bottom ends of the first bottom electrodes 222 and the conductors 106.

Figure 6:
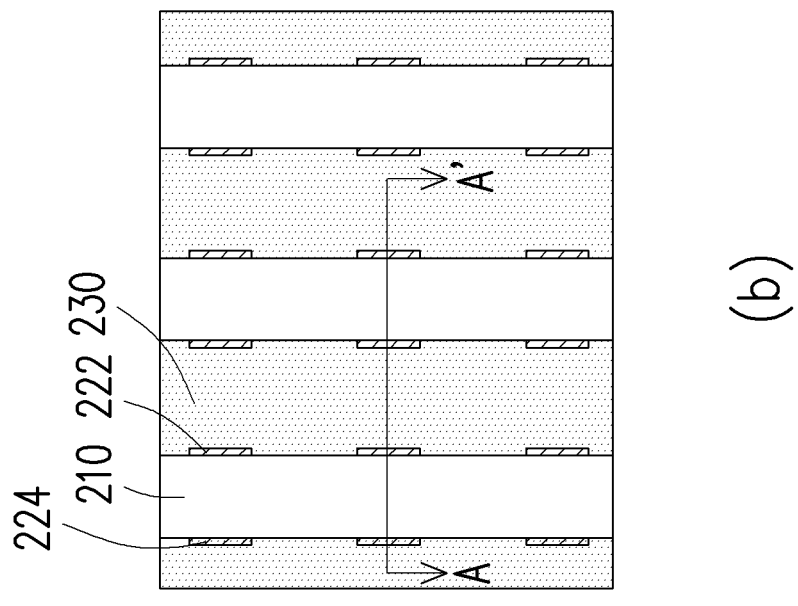
Figure 6:
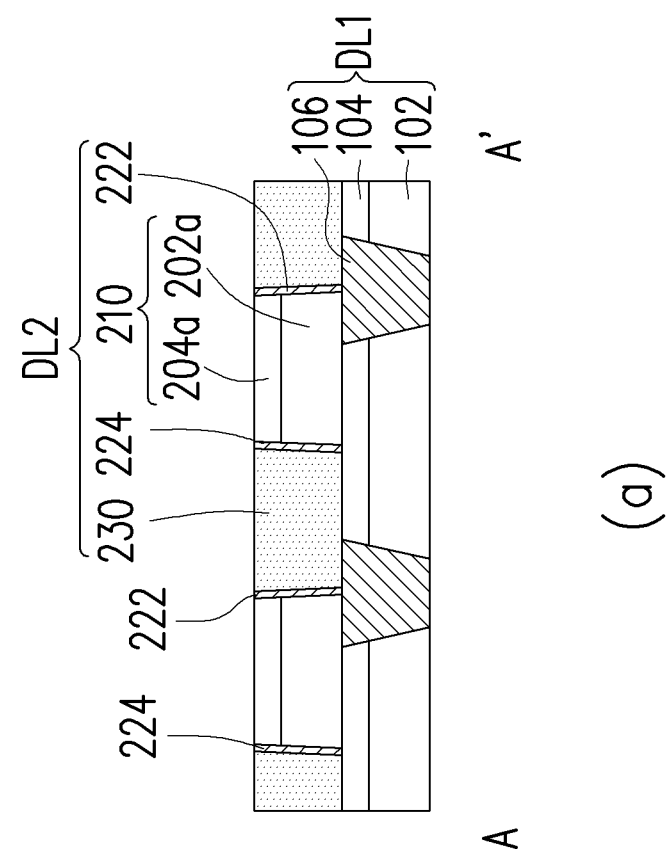

Referring to FIG. 5 and FIG. 6, second dielectric patterns 230 are formed on the dielectric layer DL1 and filled in the trenches 216 between the adjacent first dielectric patterns 210, such that a dielectric layer DL2 including the first bottom electrodes 222, the second bottom electrodes 224, the first dielectric patterns 210, and the second dielectric patterns 230 is formed on the dielectric layer DL1. The first dielectric patterns 210 are spaced apart from one another by the second dielectric patterns 230. The conductors 106 under the dielectric layer DL2 are in contact with the first dielectric patterns 210 and the second dielectric patterns 230.

The first bottom electrodes 222 are disposed between the first sidewalls 212 of the first dielectric patterns 210 and sidewalls of the second dielectric patterns 230 that face the first sidewalls 212. The first bottom electrodes 222 may interface portions of the first sidewalls 212 of the first dielectric pattern 210 and portions of the sidewalls of the second dielectric patterns 230. For example, with reference to FIG. 6, the first sidewalls 212 may each have first portions where the first bottom electrodes 222 are disposed and second portions where the sidewall of the second dielectric pattern 230 is in contact with. The first bottom electrodes 222 may interface the first portions of the first sidewalls 212 of the first dielectric patterns 210 and the portions of the sidewalls of the second dielectric patterns 230 that face the first portions of the first sidewalls 212.

The second bottom electrodes 224 are disposed between the second sidewalls 214 of the first dielectric patterns 210 and sidewalls of the second dielectric patterns 230 that face the second sidewalls 214. The second bottom electrodes 222 may interface portions of the second sidewalls 214 of the first dielectric pattern 210 and portions of the sidewalls of the second dielectric patterns 230. For example, with reference to FIG. 6, the second sidewalls 214 may each have first portions where the second bottom electrodes 224 are disposed and second portions where the sidewall of the second dielectric pattern 230 is in contact with. The second bottom electrodes 222 may interface the first portions of the second sidewalls 214 of the first dielectric patterns 210 and the sidewalls of the second dielectric patterns 230 that face the first portions of the second sidewalls 214.

In some embodiments, the second dielectric patterns 230 includes a dielectric material, such as silicon oxide, silicon nitride, silicon oxynitride, a spin-on dielectric material, or a low-k dielectric material. The second dielectric patterns 230 may be formed by any suitable method, such as chemical vapor deposition (CVD). In some embodiments, the second dielectric patterns 230 may be formed by following steps. First, a dielectric material layer (not illustrated) is formed on the dielectric layer DL1 to cover the first dielectric patterns 210 and fill the trenches 216 between the adjacent first dielectric patterns 210. The dielectric material layer may cover top surfaces of the first dielectric patterns 210. Then, a planarization process (e.g., CMP process) is performed to remove excessive dielectric material layer on the first dielectric pattern 210, so as to form the second dielectric patterns 230. In some alternative embodiments, the dielectric material layer is slightly over-polished, so that the top ends of the first bottom electrodes 222 and the second bottom electrodes 224 is slightly over-polished to have flat top surfaces. In the case where the dielectric material layer is slightly over-polished, the top surfaces of the first bottom electrodes 222, the second bottom electrodes 224, the first dielectric patterns 210, and the second dielectric patterns 230 are substantially coplanar.

In some embodiments, with reference to the top view illustrated in (b) of FIG. 6, the first bottom electrodes 222 disposed at the same side of the first dielectric pattern 210 are arranged along the extending direction of the first dielectric pattern 210 and spaced apart from one another by the second dielectric pattern 230. For example, the first bottom electrodes 222 disposed on the same first sidewall 212 of the first dielectric pattern 210 are arranged along the extending direction of the first dielectric pattern 210 and spaced apart from one another by the second dielectric pattern 230. The second bottom electrodes 224 disposed at the same side of the first dielectric pattern 210 are arranged along the extending direction of the first dielectric pattern 210 and spaced apart from one another by the second dielectric pattern 230. For example, the second bottom electrodes 224 on the same second sidewall 214 of the first dielectric pattern 210 are arranged along the extending direction of the first dielectric pattern 210 and spaced apart from one another by the second dielectric pattern 230.

Referring to FIG. 6 and FIG. 7, first storage patterns 301 are formed on the dielectric layer DL2 and electrically connected to the corresponding first bottom electrodes 222. Each of the first storage patterns 301 is disposed on the first dielectric pattern 210, the second dielectric pattern 230, and the first bottom electrode 222. In some embodiments, the second bottom electrodes 224 may be electrically insulated from the first storage patterns 301 and may each configure to separate from the corresponding first storage pattern 301 by a distance in a top view. In some embodiments, the first storage patterns 301 may include a phase change material when the memory cells 100 (as shown in FIG. 9) are PCRAM cells. The phase change material may include a chalcogenide material, such as an indium(In)-antimony(Sb)-tellurium(Te) (IST) material or a germanium(Ge)-antimony(Sb)-tellurium(Te) (GST) material. The IST material may include $In_2Sb_2Te_5$, $In_1Sb_2Te_4$, $In_1Sb_4Te_7$, or the like. The GST material may include $Ge_8Sb_5Te_8$, $Ge_2Sb_2Te_5$, $Ge_1Sb_2Te_4$, $Ge_1Sb_4Te_7$, $Ge_4Sb_4Te_7$, $Ge_4SbTe_2$, $Ge_6SbTe_2$, or the like. The hyphenated chemical composition notation, as used herein, indicates the elements included in a particular mixture or compound, and is intended to represent all stoichiometries involving the indicated elements. Other phase change materials may include, for instance, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt. Other storage materials include transition metal oxide materials or alloys including two or more metals, such as transition metals, alkaline earth metals, and/or rare earth metals. The first storage patterns 301 may be formed by any suitable method, such as CVD, atomic layer deposition (ALD), or the like. Embodiments are not limited to a particular storage material or materials associated with the storage elements of the PCRAM cell. In some alternative embodiments, the storage element material is used for a resistive random access memory (RRAM) cell, a magnetoresistive random access memory (MRAM) cell, a ferroelectric random access memory (FeRAM) cell, or a combination thereof. That is, the storage materials may include binary metal oxide materials, colossal magnetoresistive materials, and/or various polymer-based resistance variable materials, or the like.

Still referring to FIG. 6 and FIG. 7, first top electrodes 302 are formed on the first storage patterns 301, respectively. Each of the first storage patterns 301 is disposed between the first bottom electrode 222 and the first top electrode 302. In some embodiments, the first top electrodes 302 include a conductive material, such as Ti, Co, Cu, AlCu, W, TiN, TiW, TiAl, TiAlN, or a combination thereof. The first top electrodes 302 are electrically connected to the first storage patterns 301. The first top electrodes 302 and the first bottom electrodes 222 may have the same material or different materials. For example, the first top electrodes 302 and the first bottom electrodes 222 are both made of TiN. The first top electrodes 222 may be formed by any suitable method, such as CVD, physical vapor deposition (PVD), or the like.

In some embodiments, the first storage patterns 301 and the first top electrodes 302 are formed by following steps. First, a storage material layer (not illustrated) and a top electrode layer (not illustrated) are sequentially formed on the dielectric layer DL2. Then, a mask pattern (not illustrated) is formed on the top electrode layer to define regions that expose the top electrode layer. The mask pattern may be a patterned photoresist layer or a patterned layer including a patterned hard mask layer, a patterned bottom anti-reflection coating (BARC) and a patterned photoresist layer stacked on the top electrode layer in sequence. After that, portions of the top electrode layer and portions of the storage material layer under the portions of the top electrode layer are removed through the regions, so as to form the first storage patterns 301 and the first top electrodes 302 stacked on the first storage patterns 301. The portions of the top electrode layer and the portions of the storage material layer under the portions of the top electrode layer may be removed by an etching process. The patterned etching stop layers 204a may serve as a stop layer during the process of removing the portions of the top electrode layer and the portions of the storage material layer. After forming the first storage patterns 301 and the first top electrodes 302, the mask pattern is removed by any suitable method, such as ashing.

Figure 8:
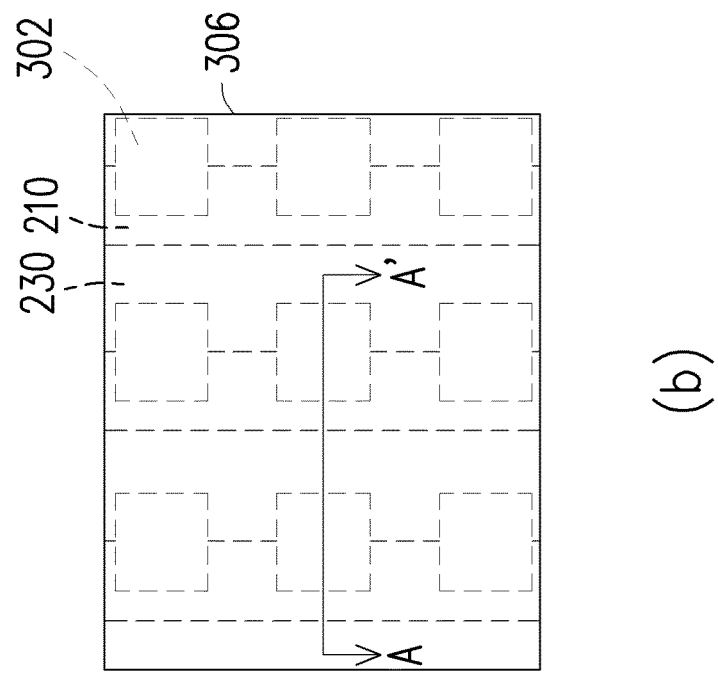
Figure 8:
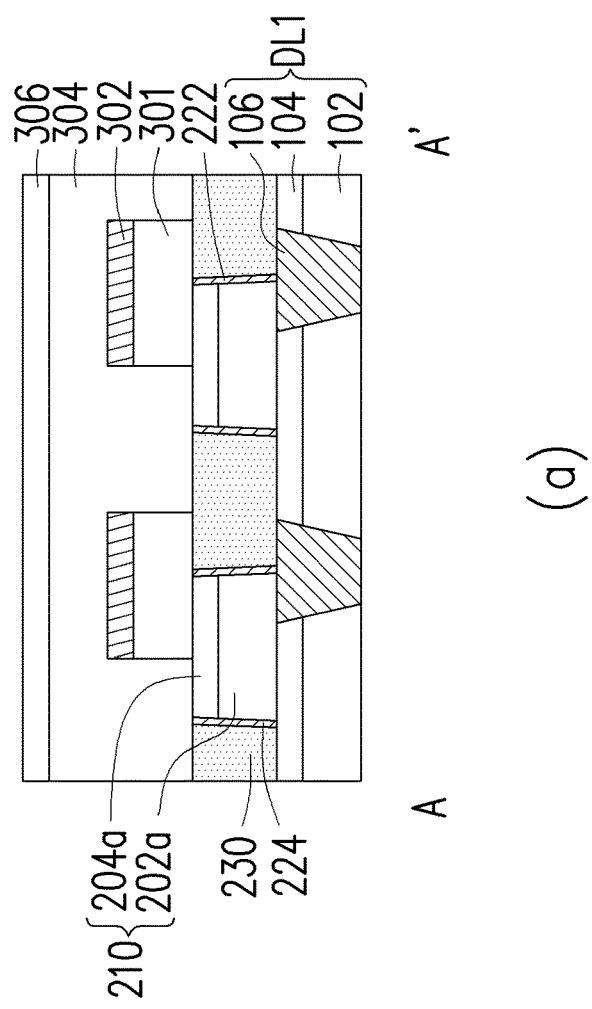

Referring to FIG. 7 and FIG. 8, a dielectric material layer 304 is formed on the dielectric layer DL2 to cover the first storage patterns 301 and the first top electrodes 302. In some embodiments, the dielectric material layer 304 is in contact with the first dielectric patterns 210, the second dielectric patterns 230, and the second bottom electrodes 224, but is not limited thereto. In some embodiments, the dielectric material layer 304 may be formed by following steps. First, a dielectric material (not illustrated) is formed on the dielectric layer DL2 to cover the first storage patterns 301 and the first top electrodes 302. Then, a planarization process (e.g., a CMP process) is performed to form the dielectric material layer 304. The dielectric material layer 304 covers top surfaces of the first top electrodes 302. In some embodiments, the dielectric material layer 304 includes a dielectric material, such as silicon oxide, silicon nitride, silicon oxynitride, a spin-on dielectric material, or a low-k dielectric material. The dielectric material layer 304 may be formed by any suitable method, such as chemical vapor deposition (CVD).

Then, an etching stop material layer 306 is formed on the dielectric material layer 304. In some embodiments, the etching stop material layer 306 includes a dielectric material, such as silicon oxide, silicon nitride, silicon oxynitride, a spin-on dielectric material. The etching stop material layer 306 may be formed by any suitable method, such as chemical vapor deposition (CVD). The etching stop material layer 306 and the dielectric material layer 304 are made of different materials. For example, the etching stop material layer 306 may be made of silicon nitride (e.g., $Si_3N_4$), and the dielectric material layer 304 may be made of silicon oxide (e.g., $SiO_2$), but is not limited thereto.

Referring to FIG. 8 and FIG. 9, conductors 308 are respectively formed in the etching stop material layer 306 and the dielectric material layer 304 to electrically connect the corresponding first top electrodes 302. In some embodiments, the conductors 308 are formed by following steps. First, a mask pattern (not illustrated) is formed on the etching stop material layer 306 to define regions that expose the etching stop material layer 306. The mask pattern may be a patterned photoresist layer. Next, portions of the etching stop material layer 306 and portions of the dielectric material layer 304 under the portions of the etching stop material layer 306 are removed through the regions, so as to form conductor openings (not illustrated) exposed the first top electrodes 302. The portions of the etching stop material layer 306 and the portions of the dielectric material layer 304 under the portions of the etching stop material layer 306 may be removed by an etching process. Then, the conductor openings are filled with conductive materials. The conductive material may cover a top surface of the etching stop material layer 306. After that, a planarization process (e.g., a CMP process) is performed to remove excessive conductive material on the top surface of the etching stop material layer 306, thereby forming the conductors 308. In some embodiments, the conductors 308 include metals or metal alloys including one or more of Al, AlCu, Cu, Ti, TiN, W, or the like.

Figure 10A:
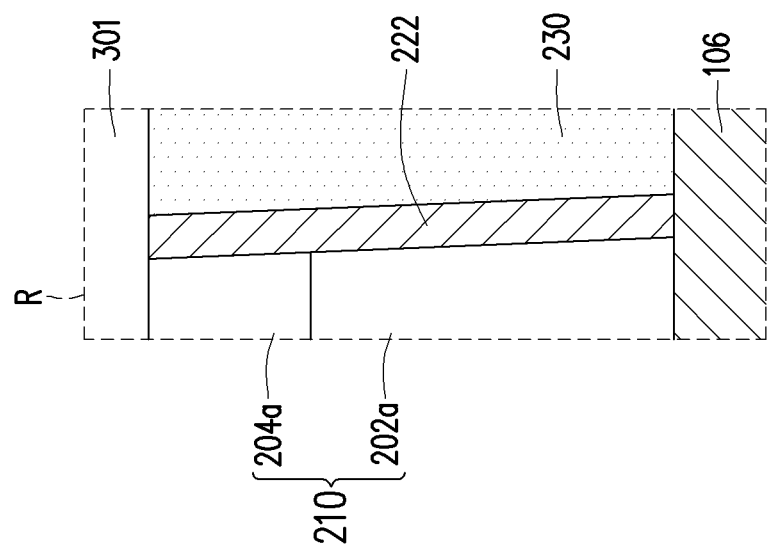
FIG. 10A and FIG. 10B are a schematic enlarge view illustrating a region R of FIG. 9 in accordance with the first embodiment.
Figure 10B:
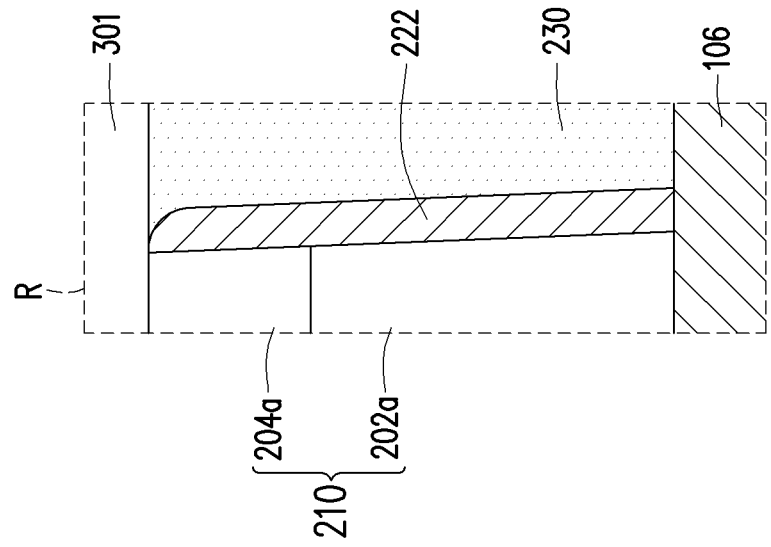

In the following, the memory cells 100 of the first embodiment are described with reference to FIG. 9. The method for manufacturing the memory cells 100 of the first embodiment are described above as an example, but is not limited thereto. FIG. 9 is a schematic view illustrating memory cells 100 in accordance with a first embodiment. FIG. 10A and FIG. 10B are a schematic enlarge view illustrating a region R of FIG. 9 in accordance with the first embodiment.

Referring to FIG. 9, memory cells 100 include first dielectric patterns 210, second dielectric patterns 230, first bottom electrodes 222, first storage patterns 301, and first top electrodes 302. The first bottom electrodes 222 are disposed between the first dielectric patterns 210 and the second dielectric patterns 230. The first bottom electrodes 222 may interface first sidewalls 212 of the first dielectric patterns 210 and sidewalls of the second dielectric patterns 230. In some embodiments, as shown in FIG. 10A, the first bottom electrodes 222 may include flat top ends in contact with the first storage patterns 301, but is not limited thereto. In some alternative embodiments, as shown in FIG. 10B, the first bottom electrodes 222 may include rounding top ends in contact with the first storage patterns 301. In some embodiments, contact area between top ends of the first bottom electrodes 222 and the first storage patterns 301 is smaller than contact area between bottom ends of the first bottom electrodes 222 and the conductors 106. As such, the contact area between the first bottom electrodes 222 and the first storage patterns 301 is small enough to efficiently confine the heat field or electrical field in PCRAM or RRAM, thereby reducing the operating current or operating voltage of PCRAM or RRAM. In some embodiments, the second bottom electrodes 224 may serve as dummy electrodes which are not in contact with and thermally coupled to the first storage patterns 301. In the case where the second bottom electrodes 224 serve as the dummy electrodes, the second bottom electrodes 224 would not generate significant impacts on the device performance, thereby the process to remove the second bottom electrodes 224 can be omitted to reduce the process complexity. In some alternative embodiments, the second bottom electrodes 224 may serve as heaters which are in contact with and thermally coupled to the first storage patterns.

In some embodiments, the first storage patterns 301 may include a phase change material when the memory cells 100 are PCRAM cells (hereinafter, PCRAM cells 100). When the first storage patterns 301 include the phase change material, each of the first storage patterns 301 has a variable phase representing a data bit. For example, each of the first storage patterns 301 has a crystalline state and an amorphous state which are interchangeable. The crystalline phase and the amorphous phase may respectively represent a binary "1" and a binary "0", or vice versa. Accordingly, the first storage patterns 301 have a variable resistance that changes with the variable phase of the first storage patterns 301. For example, the first storage patterns 301 have a high resistance in the amorphous state and a low resistance in the crystalline state. In the operation of the PCRAM cells 100, the data states of the PCRAM cells 100 are read by measuring the resistance of the PCRAM cells 100 (e.g., the resistance from the first bottom electrodes 222 to the first top electrodes 302), and the data states of the PCRAM cells 100 may be set and reset by changing the phase of the first storage patterns 301.

In some embodiments, the states of the first storage patterns 301 in the PCRAM cells 100 are changed by heating. For example, the first bottom electrodes 222 are referred to as heaters to heat the first storage patterns 301 to a temperature that induces crystallization of the first storage patterns 301, so as to change the states of the first storage patterns 301 from the amorphous state to the crystalline state (e.g., to set the PCRAM cells 100). Similarly, the first bottom electrodes 222 heat the first storage patterns 301 to a temperature that melts the first storage patterns 301, so as to change the first storage patterns 301 from the crystalline state to the amorphous state (e.g., to reset the PCRAM cells 100).

Based on the above, since the first bottom electrodes 222 are disposed on the first sidewalls 212 of the first dielectric patterns 210, the contact area between the top ends of the first bottom electrodes 222 and the first storage patterns 301 is small enough to efficiently confine the heat field or electrical field in the memory cells 100, thereby the operating current or operating voltage of the memory cells 100 can be reduced.

Figure 11:
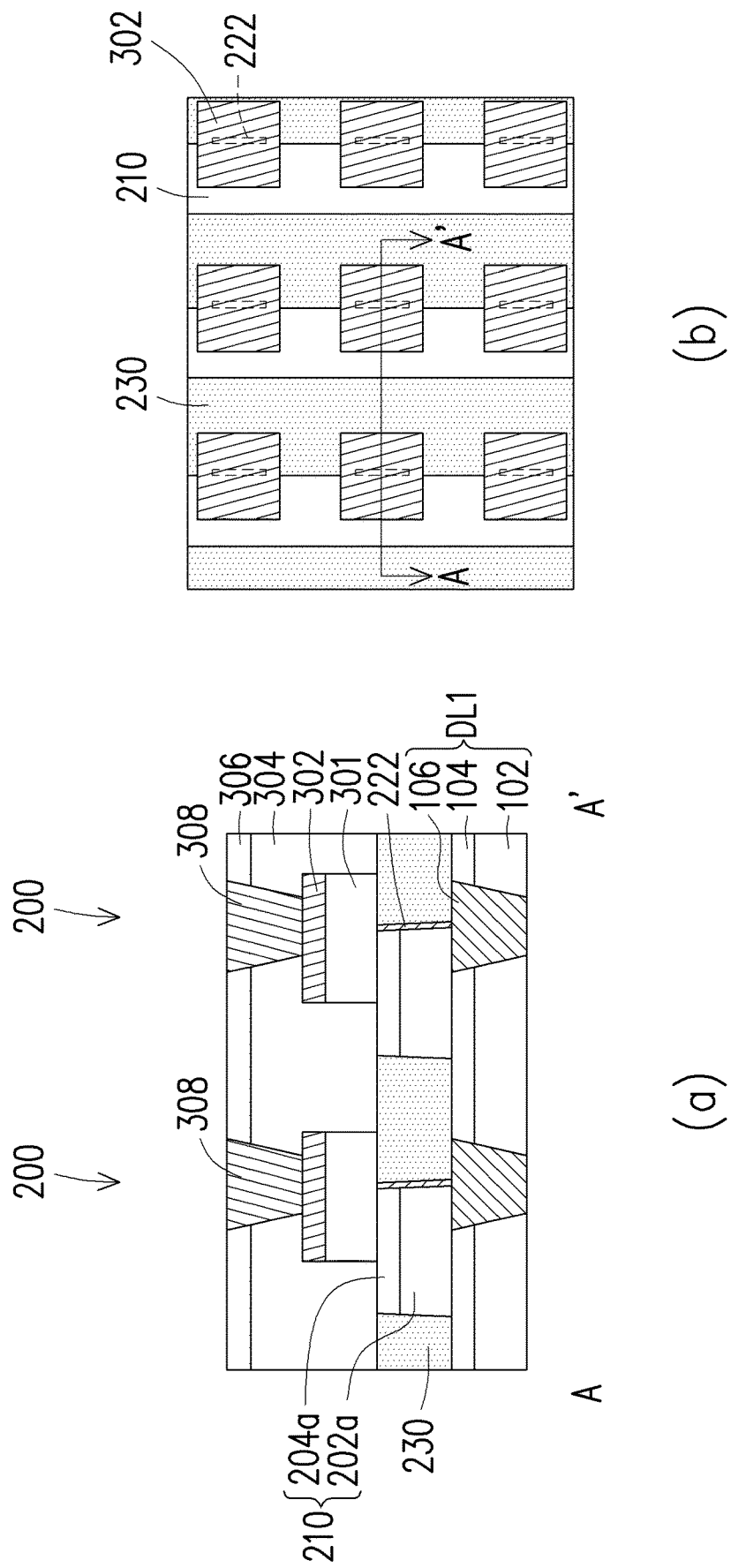
FIG. 11 is a schematic view illustrating a memory cell in accordance with a second embodiment.

FIG. 11 is a schematic view illustrating a memory cell in accordance with a second embodiment. In FIG. 11, (a) and (b) are respectively a cross-section view and a top view, wherein the cross-section view is taken along line A-A' as shown in the top view. For the convenience of explanation, (b) of FIG. 11 only shows a schematic top view of the first dielectric patterns 210, second dielectric patterns 230, and first top electrodes 302 to clearly understand the corresponding relationships between respective elements.

Referring to FIG. 11, memory cells 200 of the second embodiment are similar to the memory cells 100 of the first embodiment. That is, the structures, materials, and functions of the memory cells 200 are similar to those of the memory cells 100, and thus the details are omitted herein. The main difference between the memory cells 200 and the memory cells 100 lies in that the second bottom electrodes 224 of the memory cells 200 are removed before forming the second dielectric pattern 230. In the case where the second bottom electrodes 224 are referred to as a dummy electrode, the removal of the second bottom electrodes 224 may reduce probable impacts on the device performance. In the case where the second bottom electrodes 224 are removed, the dielectric material layer 304 is in contact with the first dielectric patterns 210 and the second dielectric patterns 230.

In some embodiments, the second bottom electrodes 224 are removed during the process of patterning the bottom electrode layers 220. For example, with reference to FIG. 4 and FIG. 11, the process of patterning the bottom electrode layers 220 is performed by following steps. First, mask patterns (not illustrated) are formed on the bottom electrode layers 220 to cover portions of the bottom electrode layers 220 on the first sidewalls 212 of the first dielectric patterns 210 and expose the bottom electrode layers 220 on the second sidewalls 214 of the first dielectric patterns 210. The mask patterns may be photoresist patterns. Then, the bottom electrode layers 220 on the second sidewalls 214 of the first dielectric patterns 210 and portions of the bottom electrode layers 220 exposed by the mask pattern on the first sidewalls 212 of the first dielectric patterns 210 are removed to form the first bottom electrodes 222 on the first sidewalls 212 of the first dielectric patterns 210. The bottom electrode layers 220 on the second sidewalls 214 of the first dielectric patterns 210 and the portions of the bottom electrode layers 220 on the first sidewalls 212 of the first dielectric patterns 210 may be removed by an etching process. After forming the first bottom electrodes 222, the mask pattern is removed by any suitable method, such as ashing.

In some alternative embodiments, the second bottom electrodes 224 are removed after the process of patterning the bottom electrode layers 220. For example, with reference to FIG. 5 and FIG. 11, the process of removing the second bottom electrode layers 224 is performed by following steps. First, a mask pattern (not illustrated) is formed on the dielectric layer DL1 to cover the first bottom electrodes 222 on the first sidewalls 212 of the first dielectric patterns 210 and expose the second bottom electrodes 224 on the second sidewalls 214 of the first dielectric patterns 210. The mask pattern may be a patterned photoresist layer. Then, the second bottom electrodes 224 exposed by the mask pattern are removed. The second bottom electrodes 224 on the second sidewalls 214 of the first dielectric patterns 210 may be removed by an etching process. After removing the second bottom electrodes 224, the mask pattern is removed by any suitable method, such as ashing.

Figure 12:
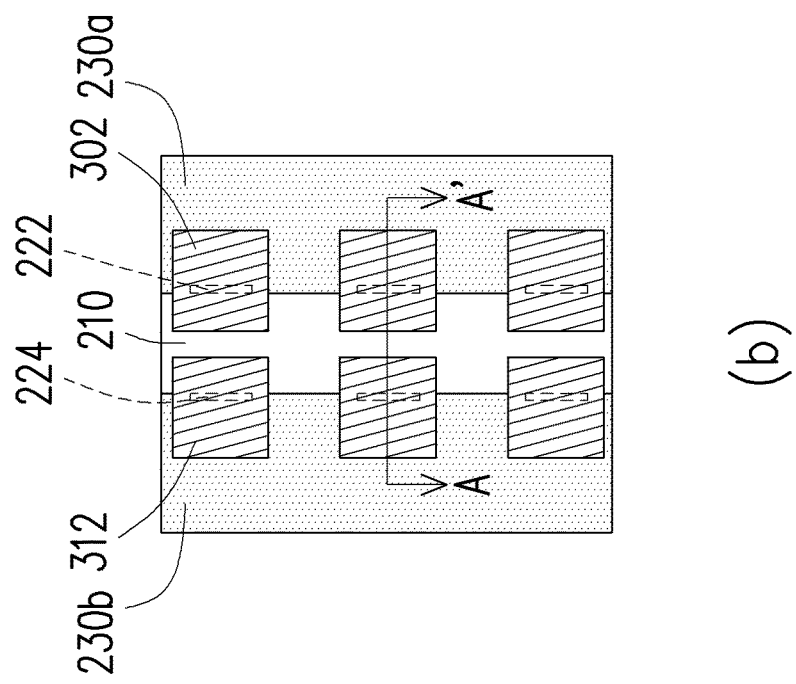
FIG. 12 is a schematic view illustrating a memory cell in accordance with a third embodiment.
Figure 12:
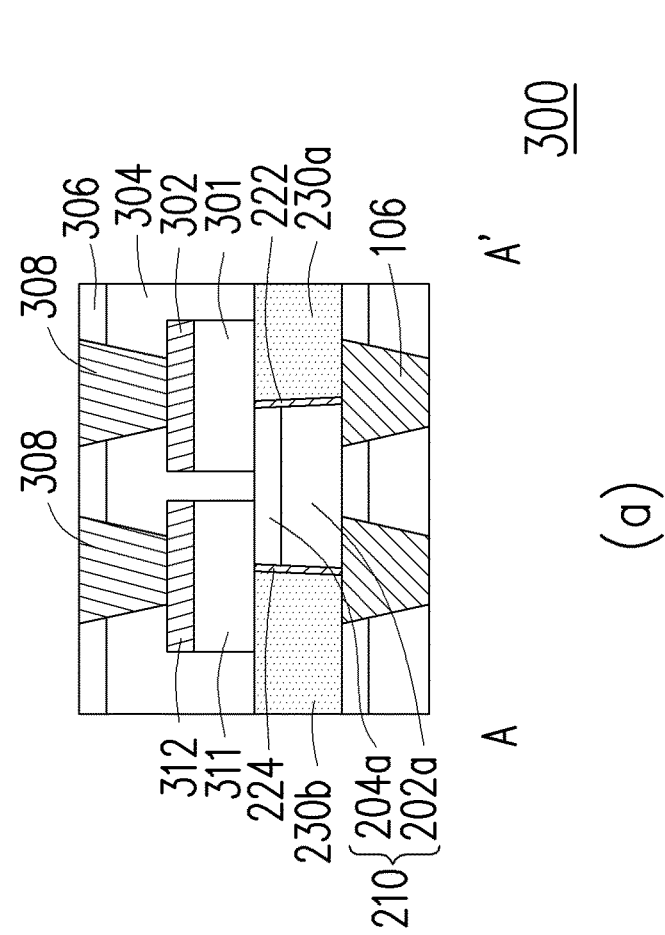

FIG. 12 is a schematic view illustrating a memory cell in accordance with a third embodiment. In FIG. 12, (a) and (b) are respectively a cross-section view and a top view, wherein the cross-section view is taken along line A-A' as shown in the top view. For the convenience of explanation, (b) of FIG. 12 only shows a schematic top view of the first dielectric patterns 210, second dielectric patterns 230a, third dielectric patterns 230b, first top electrodes 302, and second top electrodes 312 to clearly understand the corresponding relationships between respective elements.

Referring to FIG. 12, memory cells 300 of the third embodiment are similar to the memory cells 100 of the first embodiment. That is, the structures, materials, and functions of the memory cells 300 are similar to those of the memory cells 100, and thus the details are omitted herein. The main difference between the memory cells 300 and the memory cells 100 lies in that the memory cells 300 further include second storage patterns 311 and second top electrodes 312 stacked on the second storage patterns 311, wherein each of the second storage patterns 311 is between the second bottom electrode 224 and the second top electrode 312. For the convenience of explanation, the second dielectric patterns at the sides of the first dielectric patterns 210 where the first bottom electrodes 222 are disposed may be referred to as second dielectric patterns 230a, and the second dielectric patterns at the other sides of the first dielectric patterns 210 where the second bottom electrodes 224 are disposed may be referred to as third dielectric patterns 230b. That is, the first bottom electrodes 222 are disposed between the first dielectric patterns 210 and the second dielectric patterns 230a, and the second bottom electrodes 224 are disposed between the first dielectric patterns 210 and the third dielectric patterns 230b. The first bottom electrodes 222 may interface portions of the first sidewalls 212 of the first dielectric pattern 210 and portions of the sidewalls of the second dielectric patterns 230a. The second bottom electrodes 224 may interface portions of the second sidewalls 214 of the first dielectric pattern 210 and portions of the sidewalls of the third dielectric patterns 230b.

The second storage patterns 311 are disposed on the first dielectric patterns 210, the third dielectric patterns 230b and the second bottom electrodes 224, and electrically connected to the second bottom electrode 224. The conductors 106 under the dielectric layer DL2 are in contact with the second bottom electrodes 224, the first dielectric patterns 210, and the third dielectric pattern 230b. The conductors 308 are disposed on and electrically connected to the second top electrodes 312. In some embodiments, the first bottom electrodes 222 and the second bottom electrodes 224 may be referred to as heaters to generate heat for the first storage patterns 301 and the second storage patterns 311, respectively. In the case where the first bottom electrodes 222 and the second bottom electrodes 224 are electrically connected to different conductors 106 and are insulated from each other, the density of the memory cells 300 can be enhanced.

In some embodiments, the second storage patterns 311 and the second top electrodes 312 stacked on the second storage patterns 311 may be formed during the process of forming the first storage patterns 301 and the first top electrodes 302, but is not limited thereto. For example, with reference to FIG. 7 and FIG. 12, the first and second storage patterns 301 and 311 and the first and second top electrodes 302 and 312 may be formed by following steps. First, a storage material layer (not illustrated) and a top electrode layer (not illustrated) are formed on the dielectric layer DL2 in sequence. Then, a mask pattern (not illustrated) is formed on the top electrode layer to define regions that expose the top electrode layer. The mask pattern may be a patterned photoresist layer or a patterned layer including a patterned hard mask layer, a patterned BARC and a patterned photoresist layer stacked on the top electrode layer in sequence. After that, portions of the top electrode layer and portions of the storage material layer under the portions of the top electrode layer are removed through the regions to form the first storage patterns 301, the first top electrodes 302 stacked on the first storage patterns 301, the second storage patterns 311, and the second top electrodes 312 stacked on the second storage patterns 311. The portions of the top electrode layer and the portions of the storage material layer under the portions of the top electrode layer may be removed by an etching process. After forming the first and second storage patterns 301 and 311 and the first and second top electrodes 302 and 312, the mask pattern is removed by any suitable method, such as ashing.

Figure 13:
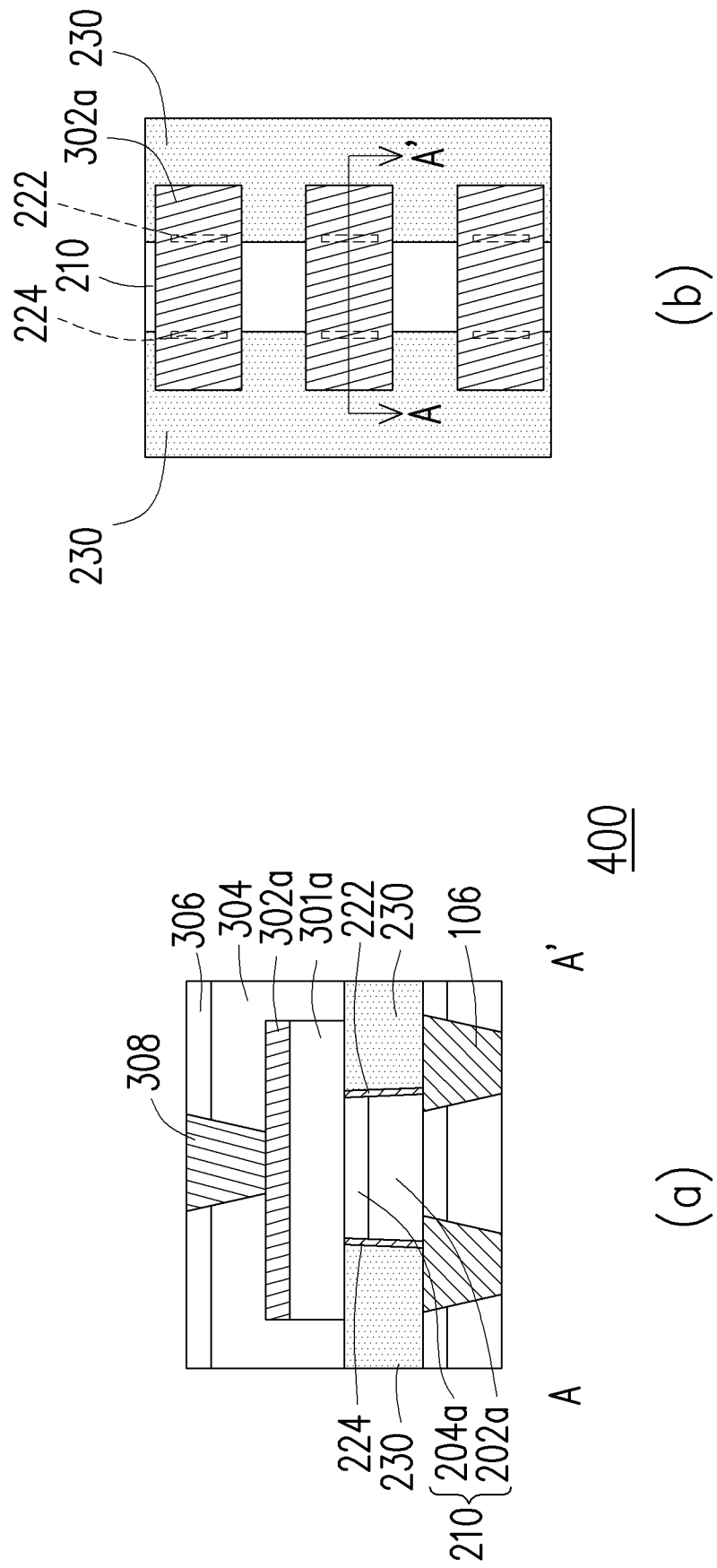
FIG. 13 is a schematic view illustrating a memory cell in accordance with a fourth embodiment.

FIG. 13 is a schematic view illustrating a memory cell in accordance with a fourth embodiment. In FIG. 13, (a) and (b) are respectively a cross-section view and a top view, wherein the cross-section view is taken along line A-A' as shown in the top view. For the convenience of explanation, (b) of FIG. 13 only shows a schematic top view of the first dielectric patterns 210, second dielectric patterns 230, and first top electrodes 302a to clearly understand the corresponding relationships between respective elements.

Referring to FIG. 13, memory cells 400 of the fourth embodiment are similar to the memory cells 100 of the first embodiment. That is, the structures, materials, and functions of the memory cells 400 are similar to those of the memory cells 100, and thus the details are omitted herein. The main difference between the memory cells 400 and the memory cells 100 lies in that the first storage patterns 301a of the memory cells 400 are electrically connected to the first bottom electrodes 222 and the second bottom electrodes 224, and each of the first storage patterns 301a is disposed between the first top electrode 302a and the first bottom electrode 222 and between the first top electrode 302a and the second bottom electrode 224. As such, in the case where the first bottom electrodes 222 and the second bottom electrodes 224 are electrically connected to different conductors 106 and are insulated from each other, the memory cells 400 have a potential to proceed a 2-bit control.

Figure 14:
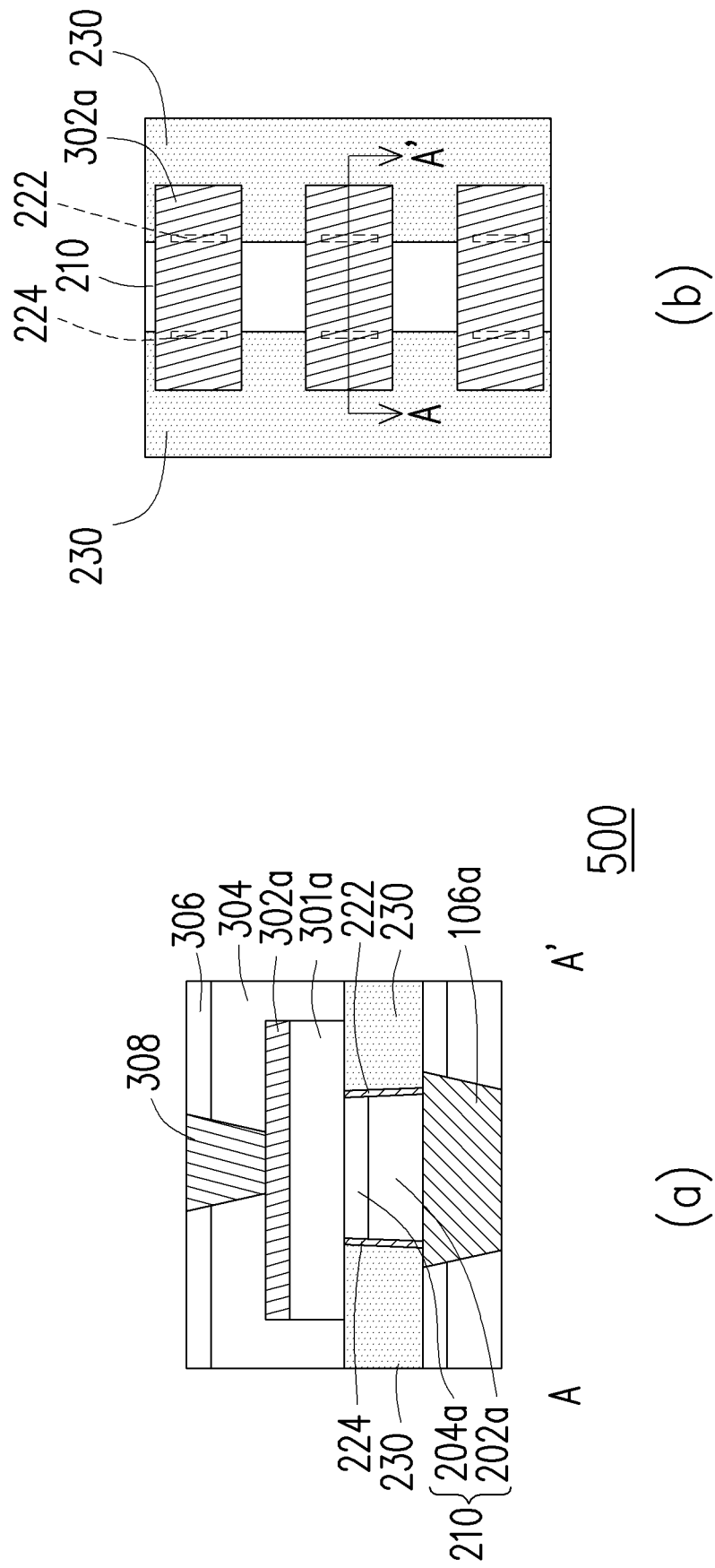
FIG. 14 is a schematic view illustrating a memory cell in accordance with a fifth embodiment.

FIG. 14 is a schematic view illustrating a memory cell in accordance with a fifth embodiment. In FIG. 14, (a) and (b) are respectively a cross-section view and a top view, wherein the cross-section view is taken along line A-A' as shown in the top view. For the convenience of explanation, (b) of FIG.

14 only shows a schematic top view of the first dielectric patterns 210, second dielectric patterns 230, and first top electrodes 302a to clearly understand the corresponding relationships between respective elements.

Referring to FIG. 14, memory cells 500 of the fifth embodiment are similar to the memory cells 400 of the fourth embodiment. That is, the structures, materials, and functions of the memory cells 500 are similar to those of the memory cells 400, and thus the details are omitted herein. The main difference between the memory cells 500 and the memory cells 400 lies in that the first bottom electrodes 222 and the second bottom electrodes 224 of the memory cells 500 are electrically connected to the same conductors 106a under the dielectric layer DL2. In some embodiments, the conductors 106a are in contact with the first dielectric patterns 210, the second dielectric patterns 230, the first bottom electrodes 222, and the second bottom electrodes 224.

Figure 15:
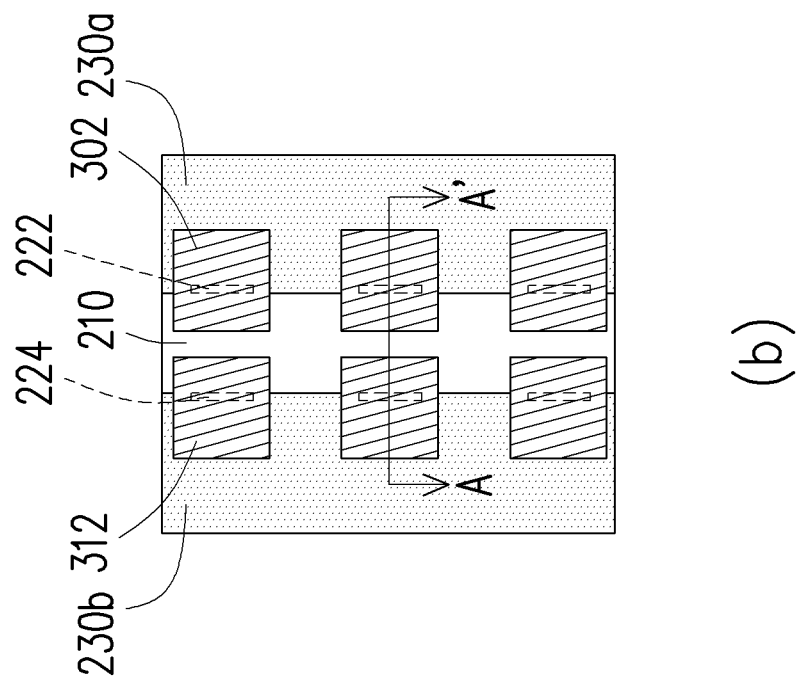
FIG. 15 is a schematic view illustrating a memory cell in accordance with a sixth embodiment.
Figure 15:
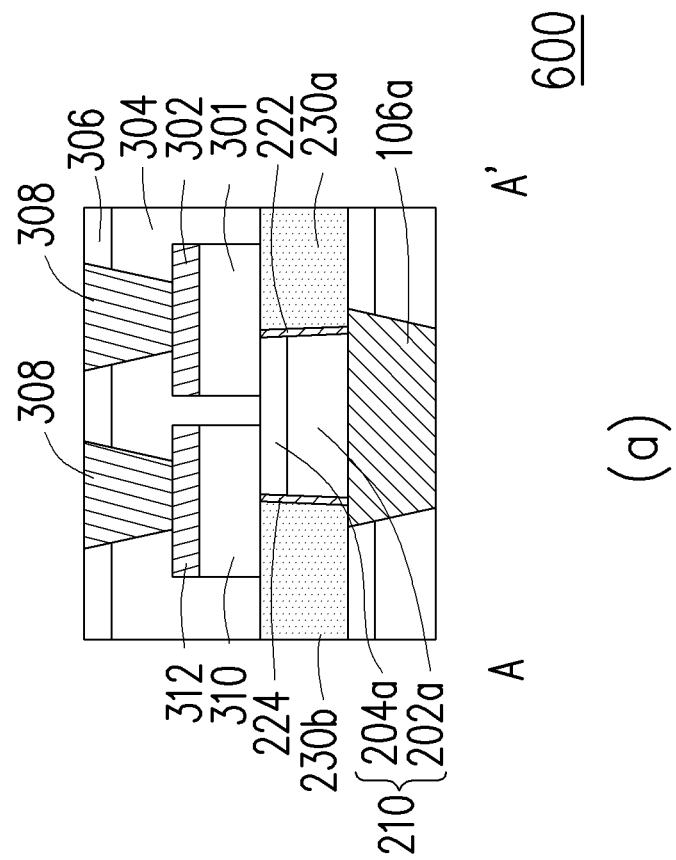

FIG. 15 is a schematic view illustrating a memory cell in accordance with a sixth embodiment. In FIG. 15, (a) and (b) are respectively a cross-section view and a top view, wherein the cross-section view is taken along line A-A' as shown in the top view. For the convenience of explanation, (b) of FIG. 15 only shows a schematic top view of the first dielectric patterns 210, second dielectric patterns 230a, third dielectric patterns 230b, first top electrodes 302, and second top electrodes 312 to clearly understand the corresponding relationships between respective elements.

Referring to FIG. 15, memory cells 600 of the sixth embodiment are similar to the memory cells 300 of the third embodiment. That is, the structures, materials, and functions of the memory cells 600 are similar to those of the memory cells 300, and thus the details are omitted herein. The main difference between the memory cells 600 and the memory cells 300 lies in that the first bottom electrodes 222 and the second bottom electrodes 224 of the memory cells 600 are electrically connected with each other through the conductors 106a under the dielectric layer DL2. In some embodiments, the conductors 106a are in contact with the first dielectric patterns 210, the second dielectric patterns 230a, the third dielectric patterns 230b, the first bottom electrodes 222, and the second bottom electrodes 224. In the case where the first bottom electrodes 222 and the second bottom electrodes 224 are electrically connected with each other through the conductors 106a under the dielectric layer DL2, heats generated by the first bottom electrodes 222 and the second bottom electrodes 224 would not interfere each other.

Figure 16:
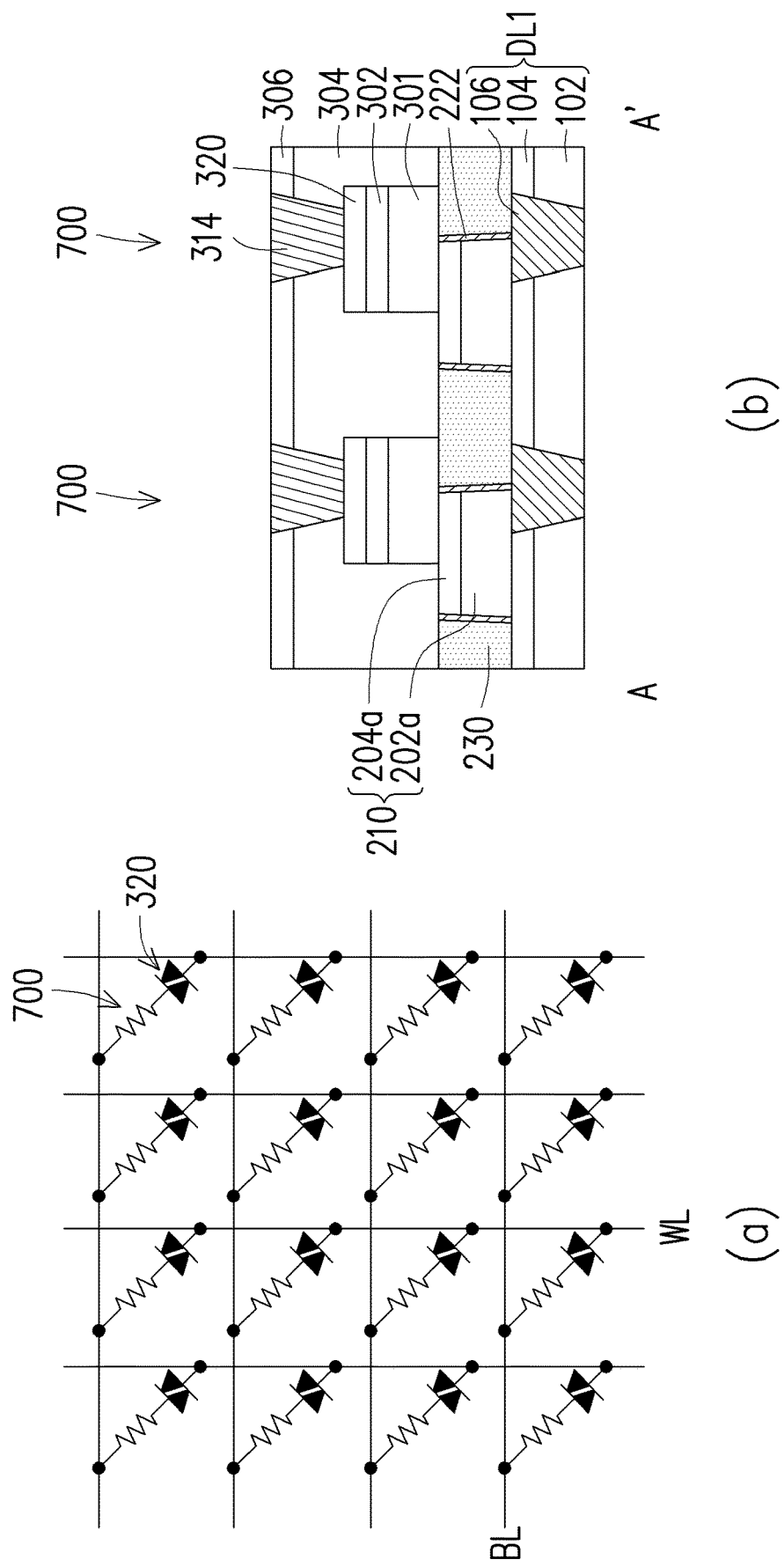
FIG. 16 is a schematic view illustrating a memory cell having a memory cell in accordance with a seventh embodiment.

FIG. 16 is a schematic view illustrating a semiconductor die having a memory cell in accordance with a seventh embodiment. In FIG. 16, (a) and (b) are respectively a circuit diagram and a cross-section related to the circuit diagram.

Referring to FIG. 16, memory cells 700 of the seventh embodiment are similar to the memory cells 200 of the second embodiment. That is, the structures, materials, and functions of the memory cells 700 are similar to those of the memory cells 200, and thus the details are omitted herein. The main difference between the memory cells 700 and the memory cells 200 lies in that the memory cells 700 further includes selectors 320 disposed on the first top electrode 302 and conductors 314 disposed on the selectors 320 to electrically connect the selectors 320 to the corresponding word lines WL. In some embodiments, the conductors 106 of the memory cells 700 in contact with the first bottom electrodes 222 may electrically connect to bit lines BL. In some alternative embodiments, the conductors 106 of the memory cells 700 may be referred to as the bit lines BL. In some embodiments, as shown in FIG. 16, one ends the selectors 320 are electrically connected to the first top electrodes 302 and the other ends of the selectors 320 are electrically connected to the word lines WL, but is not limited thereto. In some alternative embodiments, one ends of the selectors 320 are electrically connected to the first bottom top electrodes 302 and the other ends of the selectors 320 are electrically connected to the bit lines BL.

In some embodiments, the selectors 320 may include an ovonic threshold switch (OTS) material. The OTS material may include a chalcogenide material that is responsive to an applied voltage across the selector. For an applied voltage that is less than a threshold voltage, the selector remains in an "off" state, e.g., an electrically nonconductive state. Alternatively, responsive to an applied voltage across the selector that is greater than the threshold voltage, the selector enters an "on" state, e.g., an electrically conductive state. That is, the selectors 320 are referred to as switches for determining to turn on or turn off the memory cells 700. In some alternative embodiments, the chalcogenide material of the OTS material is different from the chalcogenide material of the first storage patterns 301.

Figure 17:
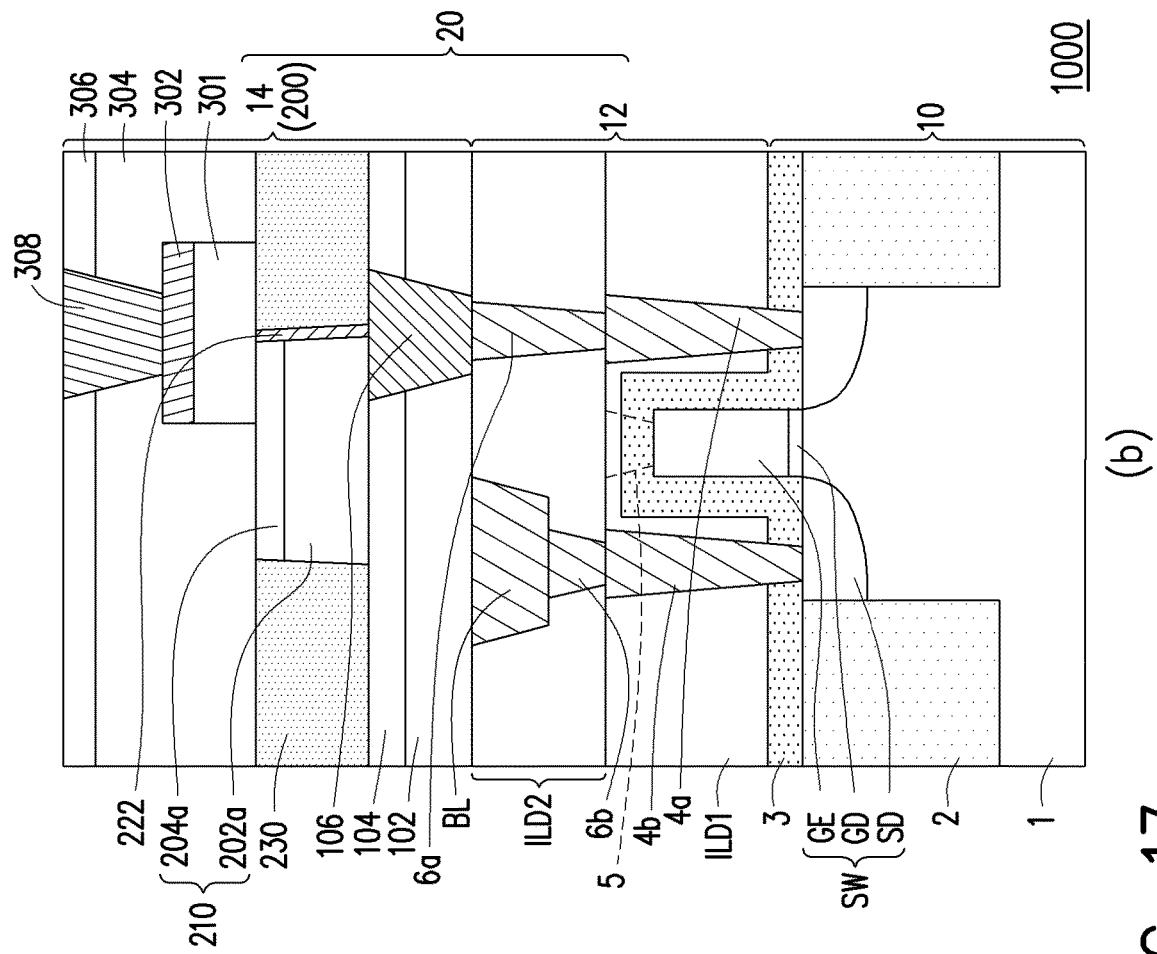
FIG. 17 is a schematic view illustrating a semiconductor die having a memory cell in accordance with an eighth embodiment.
Figure 17:
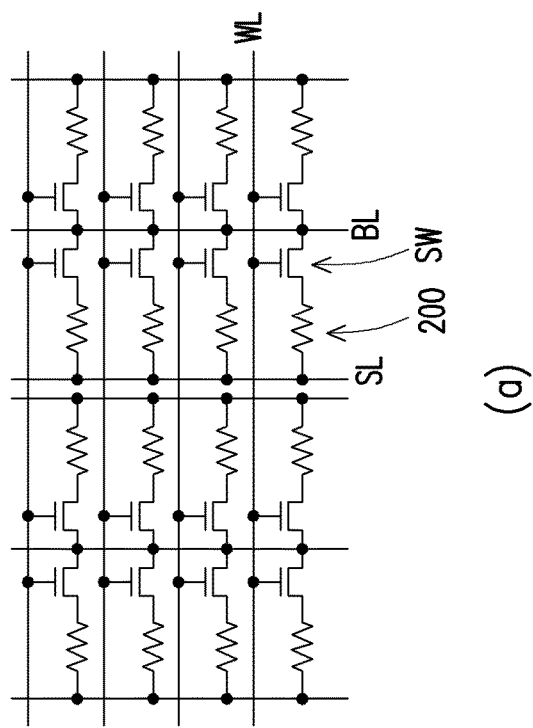

FIG. 17 is a schematic view illustrating a semiconductor die having a memory cell in accordance with an eighth embodiment. In FIG. 17, (a) and (b) are respectively a circuit diagram and a cross-section related to the circuit diagram.

Referring to FIG. 17, a semiconductor die 1000 may include a semiconductor substrate 10 including switches SW and an interconnect structure 20 disposed on and electrically connected to the switches SW. The interconnect structure 20 may include a first interconnect structure 12 and a second interconnect structure 14 on the first interconnect structure 12. The first interconnect structure 12 may include a dielectric layer ILD1, a dielectric layer ILD2 on the dielectric layer ILD1, conductors 4a, 4b, and 5 in the dielectric layer ILD1, conductors 6a and 6b in the dielectric layer ILD2, and bit lines BL in the dielectric layer ILD2. The dielectric layers ILD1 and ILD2 may be made of a dielectric material, such as silicon oxide, silicon nitride, silicon oxynitride, a spin-on dielectric material, or a low-k dielectric material. The conductors 4a, 4b, 5, 6a, 6b may be conductive vias and may include commonly used conductive materials, such as metals or metal alloys including one or more of Al, AlCu, Cu, Ti, TiN, W, and the like. The bit lines BL may be conductive lines and may include commonly used conductive materials, such as metals or metal alloys including one or more of Al, AlCu, Cu, Ti, TiN, W, and the like. The second interconnect structure 14 includes a memory cell array that includes memory cells 200. The structures, materials, and processes related to the memory cells 200 may be similar to what are shown in, and discussed referring to, FIG. 11. The details are thus no repeated herein.

In some embodiments, the semiconductor substrate 10 may be formed in a front-end-of-line (FEOL) process. That is, the semiconductor substrate 10 may include a wide variety of devices. In some alternative embodiments, the devices include active components, passive components, or a combination thereof. In some other embodiments, the devices include integrated circuits devices. The devices are, for example, transistors, capacitors, resistors, diodes, photodiodes, fuse devices, or other similar devices. In some embodiments, the semiconductor substrate 10 may include a substrate 1, isolation structures 2, an etching stop layer 3, and switches SW.

In some embodiments, the substrate 1 may be a semiconductor substrate, such as a bulk semiconductor, a semiconductor-on-insulator (SOI) substrate, or the like. The substrate 1 may be doped (e.g., with a p-type or an n-type dopant) or undoped. The substrate 1 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 1 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

The isolation structures 2 are formed in the substrate to define regions where the switches SW are located. The isolation structures 2 may be a shallow trench isolation (STI) structure, a field oxide (FOX), or other suitable isolation structures. In some embodiments, the isolations structures 2 may be formed by following steps. First, a mask pattern is formed on the substrate 1 to define regions that expose the substrate 1. The mask pattern may be a patterned photoresist layer. Next, portions of the substrate 1 are removed through the regions to form trenches (not shown) in the substrate 1. Then, the trenches are filled with dielectric materials. The portions of the substrate 1 may be removed by an etching process. The dielectric material may cover a top surface of the substrate 1. After that, a planarization process (e.g., a CMP process) is performed to remove excessive dielectric material, thereby the isolation structures 2 are formed in the substrate 1. The dielectric material may be a commonly used isolation material, such as silicon oxide or some other suitable dielectric material. The dielectric material may be formed by any suitable method, such as chemical vapor deposition (CVD).

In some embodiments, the switches SW may each include a gate electrode GE, a gate dielectric GD, and source/drains SD. The gate electrodes GE are disposed on the regions of the substrate 1 that define by the isolation structures 2. The gate electrodes GE may include commonly used gate material such as doped polysilicon, metal (e.g., tungsten, aluminum, etc.), silicide (e.g., titanium silicide, nickel silicide, etc.), or some other suitable conductive materials. The gate dielectrics GD are disposed between the gate electrodes GE and the substrate 1. The gate dielectrics GD may include commonly used gate dielectric material such as oxides (e.g., $SiO_2$), high-k dielectric materials (e.g., a dielectric material with a dielectric constant greater than 3.9), or some other suitable dielectric materials. The source/drains SD are disposed in the regions of the substrate 1 that define by the isolation structures 2 and positioned at two sides of the gate electrodes GE. Channels (not illustrated) are located between the source/drains SD and under the gate electrode GE. The switch SW may be a N-type metal-oxide semiconductor (NMOS) device or a P-type metal-oxide semiconductor (PMOS) device and may be formed and interconnected to perform one or more functions.

In some embodiments, the switches SW, as shown in FIG. 17, may be transistors for being selectors (hereinafter, selectors SW) to determine whether the memory cells 200 are turn-on or turn-off. In some embodiment, one ends of the selectors SW may be electrically connected to the first bottom electrodes 222 of the memory cells 200 through conductors 4a, conductors 6a and conductors 106. The other ends of the selectors SW may be electrically connected to the bit line BL through conductors 4b, conductors 6b. The gate electrodes GE of the selectors SW may be electrically connected to word lines WL through conductors 5. The first top electrode 302 of the memory cells 200 may be electrically connected to source lines SL through conductors 308. In the case where the switches SW are being selectors, the semiconductor substrate 10 may further include switches (not illustrated) for transmitting signals for operating memory cells 200.

According to some embodiments, a memory cell includes a first dielectric pattern, a second dielectric pattern, a first bottom electrode, a first storage pattern, and a first top electrode. The first bottom electrode is disposed between the first dielectric pattern and the second dielectric pattern, and the first bottom electrode interfaces a first sidewall of the first dielectric pattern and a sidewall of the second dielectric pattern. The first storage pattern is disposed on the first dielectric pattern, the second dielectric pattern and the first bottom electrode, wherein the first storage pattern is electrically connected to the first bottom electrode. The first storage pattern is between the first bottom electrode and the first top electrode. In some embodiments, the memory cell further includes a dummy electrode disposed on a second sidewall of the first dielectric pattern opposite to the first sidewall of the first dielectric pattern, wherein the dummy electrode is electrically insulated from the first storage pattern. In some embodiments, the first bottom electrode includes a rounding top end in contact with the first storage pattern. In some embodiments, an area of a top end of the first bottom electrode is smaller than that of a bottom end of the first bottom electrode. In some embodiments, the memory cell further includes a conductor disposed under the first dielectric pattern and the second dielectric pattern and electrically connected to a bottom end of the first bottom electrode, and the conductor is in contact with the first dielectric pattern and the second dielectric pattern. In some embodiments, the memory cell further includes a selector electrically connected to the first storage pattern. In some embodiments, the memory cell further includes a third dielectric pattern, a second bottom electrode, a second storage pattern, and a second top electrode. The second bottom electrode is disposed between the first dielectric pattern and the third dielectric pattern, and the second bottom electrode interfaces a second sidewall of the first dielectric pattern and a sidewall of the third dielectric pattern. The second storage pattern is disposed on the first dielectric pattern, the third dielectric pattern and the second bottom electrode, wherein the second storage pattern is electrically connected to the second bottom electrode. The second storage pattern is between the second bottom electrode and the second top electrode. In some embodiments, the memory cell further includes a second bottom electrode disposed on a second sidewall of the first dielectric pattern opposite to the first sidewall of the first dielectric pattern, wherein the first storage pattern is electrically connected to the second bottom electrode and disposed between the second bottom electrode and the first top electrode. In some embodiments, the first bottom electrode and the second bottom electrode are electrically connected to a conductor. In some embodiments, the first bottom electrode is insulated from the second bottom electrode.

According to some embodiments, a semiconductor die includes a semiconductor substrate and an interconnect structure. The semiconductor substrate includes first switches. The interconnect structure is disposed on and electrically connected to the first switches, and the interconnect structure includes a memory cell array. The memory cell array includes a dielectric layer, a first storage pattern, and a first top electrode. The dielectric layer includes first dielectric patterns, second dielectric patterns and first bottom electrodes, wherein the first dielectric patterns are spaced apart from one another by the second dielectric patterns, and the first bottom electrodes are disposed between a first sidewall of the first dielectric pattern and a sidewall of the second dielectric pattern. The first storage pattern is disposed on the dielectric layer and the first bottom electrode, wherein the first storage pattern is electrically connected to the first bottom electrode. The first storage pattern is between the first bottom electrode and the first top electrode. In some embodiments, the semiconductor die further includes a dummy electrode disposed on a second sidewall of the first dielectric pattern opposite to the first sidewall of the first dielectric pattern, wherein the dummy electrode is electrically insulated from the first storage pattern. In some embodiments, the semiconductor die further includes a conductor disposed under the dielectric layer and electrically connected to a bottom end of the first bottom electrode, and the conductor is in contact with the first dielectric pattern and the second dielectric pattern. In some embodiments, the semiconductor die further includes second bottom electrodes, a second storage pattern, and a second top electrode. The second bottom electrodes are disposed on a second sidewall of the first dielectric pattern, and the second bottom electrodes are spaced apart from one another by the second dielectric patterns. The second storage pattern is disposed on the dielectric layer and the second bottom electrode, wherein the second storage pattern is electrically connected to the second bottom electrode. The second storage pattern is between the second bottom electrode and the second top electrode. In some embodiments, the semiconductor die further includes a second bottom electrode disposed on a second sidewall of the first dielectric pattern opposite to the first sidewall of the first dielectric pattern, wherein the first storage pattern is electrically connected to the second bottom electrode and disposed between the second bottom electrode and the first top electrode. In some embodiments, the first bottom electrode is insulated from the second bottom electrode. In some embodiments, the semiconductor die further includes a second switch electrically connected to the first storage pattern.

According to some embodiments, a method of forming a memory cell includes: forming a first dielectric pattern on a dielectric layer; forming a bottom electrode on a first sidewall of the first dielectric pattern; forming a second dielectric pattern on the dielectric layer, wherein the bottom electrode interfaces the first sidewall of the first dielectric pattern and a sidewall of the second dielectric pattern; forming a storage pattern on the first dielectric pattern, the second dielectric pattern and the bottom electrode, wherein the storage pattern is electrically connected to the bottom electrode; and forming a top electrode on the storage pattern, wherein the storage pattern is between the bottom electrode and the top electrode. In some embodiments, a step of forming the bottom electrode includes: forming a bottom electrode layer on the dielectric layer to cover the first dielectric pattern, wherein the bottom electrode layer covers a top surface of the first dielectric pattern, the first sidewall of the first dielectric pattern and a second sidewall of the first dielectric pattern opposite to the first sidewall of the first dielectric pattern; patterning the bottom electrode layer to from a bottom electrode on the first sidewall of the first dielectric pattern and a dummy electrode on the second sidewall of the first dielectric pattern; and removing the dummy electrode. In some embodiments, the method of forming the memory cell further includes: forming a conductor in the dielectric layer, wherein the conductor is disposed under the first dielectric pattern and the second dielectric pattern and electrically connected to the bottom electrode, and the conductor is in contact with the first dielectric pattern and the second dielectric pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
   a first dielectric pattern;
   a second dielectric pattern;
   a first bottom electrode disposed between the first dielectric pattern and the second dielectric pattern, and the first bottom electrode interfacing a first sidewall of the first dielectric pattern and a first sidewall of the second dielectric pattern;
   a first storage pattern disposed on the first dielectric pattern, the second dielectric pattern and the first bottom electrode, wherein the first storage pattern is electrically connected to the first bottom electrode;
   a first dummy electrode disposed on a second sidewall of the first dielectric pattern opposite to the first sidewall of the first dielectric pattern, wherein the first dummy electrode is electrically insulated from the first storage pattern; and
   a first top electrode, wherein the first storage pattern is between the first bottom electrode and the first top electrode.

2. The memory cell of claim 1, wherein the first bottom electrode comprises a rounding top end in contact with the first storage pattern.

3. The memory cell of claim 1, wherein an area of a top end of the first bottom electrode is smaller than that of a bottom end of the first bottom electrode.

4. The memory cell of claim 1, further comprising:
   a conductor disposed under the first dielectric pattern and the second dielectric pattern and electrically connected to a bottom end of the first bottom electrode, and the conductor is in contact with the first dielectric pattern and the second dielectric pattern.

5. The memory cell of claim 4, further comprising:
   a selector electrically connected to the first storage pattern.

6. The memory cell of claim 1, further comprising:
   a third dielectric pattern and a fourth dielectric pattern, wherein the second dielectric pattern and the third dielectric pattern are disposed between the first dielectric pattern and the fourth dielectric pattern;
   a second bottom electrode disposed between the third dielectric pattern and the fourth dielectric pattern, and the second bottom electrode interfacing a first sidewall of the third dielectric pattern;
   a second storage pattern disposed on the third dielectric pattern, the fourth dielectric pattern and the second bottom electrode, wherein the second storage pattern is electrically connected to the second bottom electrode; and a second top electrode, wherein the second storage pattern is between the second bottom electrode and the second top electrode.

7. The memory cell of claim 6, further comprising:
a second dummy electrode disposed on a second sidewall of the second dielectric pattern opposite to the first sidewall of the second dielectric pattern, and the second dummy electrode interfacing the second sidewall of the second dielectric pattern and a second sidewall opposite to the first sidewall of the third dielectric pattern, wherein the second dummy electrode is electrically insulated from the second storage pattern.

8. The memory cell of claim 6, wherein a top surface of the first dielectric pattern is substantially coplanar with a top surface of the third dielectric pattern.

9. The memory cell of claim 6, wherein the first dielectric pattern and the third dielectric pattern respectively have a patterned dielectric layer and a patterned etching stop layer on the patterned dielectric layer.

10. The memory cell of claim 9, wherein a top surface of the patterned etching stop layer of the first dielectric pattern is substantially coplanar with a top surface of the patterned etching stop layer of the third dielectric pattern.

11. The memory cell of claim 1, further comprising:
a second dummy electrode disposed on a second sidewall of the second dielectric pattern opposite to the first sidewall of the second dielectric pattern, wherein the second dummy electrode is electrically insulated from the first storage pattern.

12. The memory cell of claim 1, wherein a top surface of the first bottom electrode is substantially coplanar with a top surface of a top surface of the first dummy electrode.

13. The memory cell of claim 1, wherein a material of the first dummy electrode is the same as a material of the first bottom electrode.

14. The memory cell of claim 1, wherein top surfaces of the first dielectric pattern, the second dielectric pattern and the first bottom electrode are substantially coplanar.

15. A semiconductor die, comprising:
a dielectric layer comprising first dielectric patterns, second dielectric patterns and first bottom electrodes, wherein the first dielectric patterns are spaced apart from one another by the second dielectric patterns, and the first bottom electrodes are disposed between a first sidewall of the first dielectric pattern and a sidewall of the second dielectric pattern;
a first storage pattern disposed on the dielectric layer and the first bottom electrode, wherein the first storage pattern is electrically connected to the first bottom electrode;
a dummy electrode disposed on a second sidewall of the first dielectric pattern opposite to the first sidewall of the first dielectric pattern, wherein the dummy electrode is electrically insulated from the first storage pattern; and
a first top electrode, wherein the first storage pattern is between the first bottom electrode and the first top electrode.

16. The semiconductor die of claim 15, further comprising:
a conductor disposed under the dielectric layer and electrically connected to a bottom end of the first bottom electrode, and the conductor is in contact with the first dielectric pattern and the second dielectric pattern.

17. The semiconductor die of claim 15, further comprising: a selector electrically connected to and disposed between the first top electrode and a conductor.

18. A method of forming a memory cell, comprising:
forming a first dielectric pattern on a dielectric layer;
forming a bottom electrode on a first sidewall of the first dielectric pattern;
forming a dummy electrode on a second sidewall of the first dielectric pattern opposite to the first sidewall of the first dielectric pattern;
forming a second dielectric pattern on the dielectric layer, wherein the bottom electrode is disposed between the first dielectric pattern and the second dielectric pattern and interfaces the first sidewall of the first dielectric pattern and a sidewall of the second dielectric pattern;
forming a storage pattern on the first dielectric pattern, the second dielectric pattern and the bottom electrode, wherein the storage pattern is electrically connected to the bottom electrode, and the dummy electrode is electrically insulated from the storage pattern; and
forming a top electrode on the storage pattern, wherein the storage pattern is between the bottom electrode and the top electrode.

19. The method of claim 18, wherein a step of forming the bottom electrode and a step of forming the dummy electrode comprise:
forming a bottom electrode layer on the dielectric layer to cover the first dielectric pattern, wherein the bottom electrode layer covers a top surface of the first dielectric pattern, the first sidewall of the first dielectric pattern and the second sidewall of the first dielectric pattern; and
patterning the bottom electrode layer to from the bottom electrode on the first sidewall of the first dielectric pattern and the dummy electrode on the second sidewall of the first dielectric pattern.

20. The method of claim 18, further comprising:
forming a conductor in the dielectric layer, wherein the conductor is disposed under the first dielectric pattern and the second dielectric pattern and electrically connected to the bottom electrode, and the conductor is in contact with the first dielectric pattern and the second dielectric pattern.

* * * * *